United States Patent
Kubik et al.

(10) Patent No.: US 11,862,518 B2
(45) Date of Patent: Jan. 2, 2024

(54) PLATED METALLIZATION STRUCTURES

(71) Applicant: Analog Devices International Unlimited Company, Limerick (IE)

(72) Inventors: Jan Kubik, Limerick (IE); Bernard P. Stenson, Limerick (IE); Michael Noel Morrissey, Limerick (IE)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 417 days.

(21) Appl. No.: 16/914,900

(22) Filed: Jun. 29, 2020

(65) Prior Publication Data

US 2020/0328114 A1  Oct. 15, 2020

Related U.S. Application Data

(62) Division of application No. 15/810,836, filed on Nov. 13, 2017, now Pat. No. 10,699,948.

(51) Int. Cl.
*H01L 21/768* (2006.01)
*H01L 23/522* (2006.01)
(Continued)

(52) U.S. Cl.
CPC .... *H01L 21/76885* (2013.01); *C23C 18/1605* (2013.01); *C23C 18/1651* (2013.01);
(Continued)

(58) Field of Classification Search
None
See application file for complete search history.

(56) References Cited

U.S. PATENT DOCUMENTS 4,334,973 A * 6/1982 Carlson ............... C09D 5/4461
204/507
4,687,552 A 8/1987 Early et al.
(Continued)

FOREIGN PATENT DOCUMENTS

CN 1728370 A 2/2006
CN 103972118 8/2014
(Continued)

OTHER PUBLICATIONS

Machined-generated English translation of KR 2008-0109281 (Year: 2008).*
(Continued)

*Primary Examiner* — Bo B Jang
(74) *Attorney, Agent, or Firm* — Knobbe, Martens, Olson & Bear LLP

(57) ABSTRACT

The disclosed technology generally relates to forming metallization structures for integrated circuit devices by plating, and more particularly to plating metallization structures that are thicker than masking layers used to define the metallization structures. In one aspect, a method of metallizing an integrated circuit device includes plating a first metal on a substrate in a first opening formed through a first masking layer, where the first opening defines a first region of the substrate, and plating a second metal on the substrate in a second opening formed through a second masking layer, where the second opening defines a second region of the substrate. The second opening is wider than the first opening and the second region encompasses the first region of the substrate.

19 Claims, 28 Drawing Sheets

(51) Int. Cl.
  *H01L 21/288*  (2006.01)
  *H01L 21/033*  (2006.01)
  *C23C 18/16*  (2006.01)
  *H01L 23/532*  (2006.01)
  *C25D 5/02*  (2006.01)
  *C25D 7/12*  (2006.01)
  *C25D 5/10*  (2006.01)
  *H05K 3/24*  (2006.01)
  *H05K 3/18*  (2006.01)
  *H05K 3/42*  (2006.01)
  *H01L 49/02*  (2006.01)
  *H05K 1/02*  (2006.01)

(52) U.S. Cl.
  CPC ............. *C25D 5/022* (2013.01); *C25D 5/10* (2013.01); *C25D 7/123* (2013.01); *H01L 21/0331* (2013.01); *H01L 21/2885* (2013.01); *H01L 21/76846* (2013.01); *H01L 21/76852* (2013.01); *H01L 21/76873* (2013.01); *H01L 23/5226* (2013.01); *H01L 23/53238* (2013.01); *H01L 28/10* (2013.01); *H05K 3/184* (2013.01); *H05K 3/244* (2013.01); *H05K 3/422* (2013.01); *H05K 1/0265* (2013.01); *H05K 3/188* (2013.01); *H05K 3/424* (2013.01); *H05K 2201/0367* (2013.01); *H05K 2201/0391* (2013.01); *H05K 2201/096* (2013.01); *H05K 2201/09563* (2013.01); *H05K 2201/09845* (2013.01); *H05K 2203/0716* (2013.01); *H05K 2203/1407* (2013.01); *H05K 2203/1423* (2013.01); *H05K 2203/1476* (2013.01)

(56) References Cited

U.S. PATENT DOCUMENTS

| | | | |
|---|---|---|---|
| 5,145,571 | A | 9/1992 | Lane et al. |
| 5,459,001 | A | 10/1995 | Estes et al. |
| 5,755,947 | A | 5/1998 | McElhanon et al. |
| 5,789,306 | A | 8/1998 | Roberts et al. |
| 6,207,553 | B1 | 3/2001 | Buynoski et al. |
| 6,413,845 | B1* | 7/2002 | Izumi ............... H01L 21/76838 438/599 |
| 7,465,654 | B2 | 12/2008 | Chou et al. |
| 8,492,263 | B2* | 7/2013 | Wang ............... H01L 23/49816 257/737 |
| 10,699,948 | B2 | 6/2020 | Kubik et al. |
| 2003/0092274 | A1 | 5/2003 | Brintzinger |
| 2003/0227096 | A1* | 12/2003 | Takaike .................. H01L 24/03 257/E23.021 |
| 2008/0258299 | A1* | 10/2008 | Kang ..................... H01L 24/32 257/737 |
| 2008/0284014 | A1 | 11/2008 | Lee et al. |
| 2009/0160049 | A1 | 6/2009 | Shinkai et al. |
| 2012/0032190 | A1 | 2/2012 | Takagi |
| 2015/0303159 | A1 | 10/2015 | Lin |
| 2016/0079193 | A1 | 3/2016 | Arvin et al. |

FOREIGN PATENT DOCUMENTS

| | | |
|---|---|---|
| DE | 10 2004 023897 | 12/2005 |
| KR | 10 2004 023897 | * 12/2005 |
| KR | 10-0769042 | 10/2007 |
| KR | 2008-0109281 | 12/2008 |
| KR | 10-1643333 | 7/2016 |
| KR | 2008-0109281 | * 12/2018 |

OTHER PUBLICATIONS

Machined-generated English translation of DE 10 2004 023897 (Year: 2005).*

Green, Todd A., "Gold Electrodeposition for Microelectronic, Optoelectronic and Microsystem Applications", 2007, pp. 105-114, vol. 40, Iss. 2, Newcastle, UK.

Hayden et al., "Helicon Plasma Source For Ionized Physical Vapor Deposition", Surface and Coatings Technology, 1999, pp. 401-404, Urbana, IL, USA.

Ting et al., Advances in copper metallization technology, Solid-State and Integrated-Circuit Technology, 2001, pp. 1-3, San Jose, CA.

Extended European Search Report dated Apr. 8, 2019 in European Patent Application No. 18 20 4206; 9 pages.

Office Action dated Mar. 24, 2020 in European Patent Application No. 18204206.9; 5 pages.

* cited by examiner

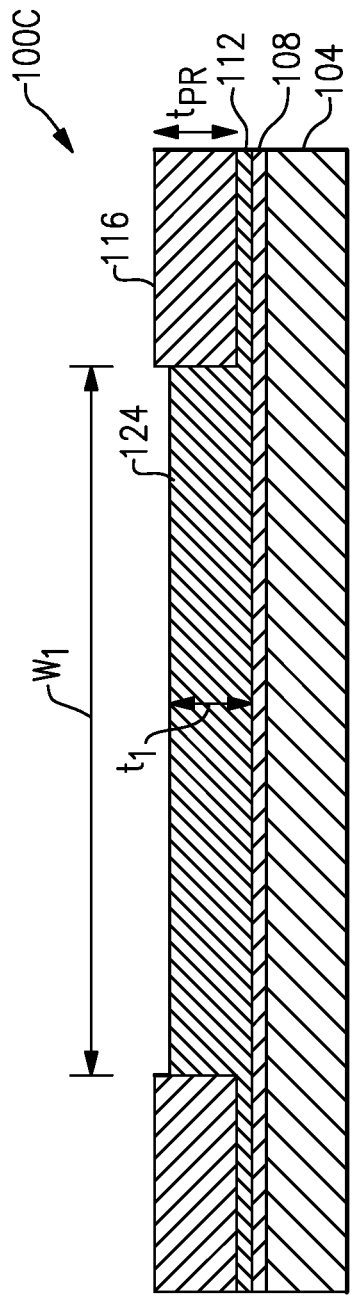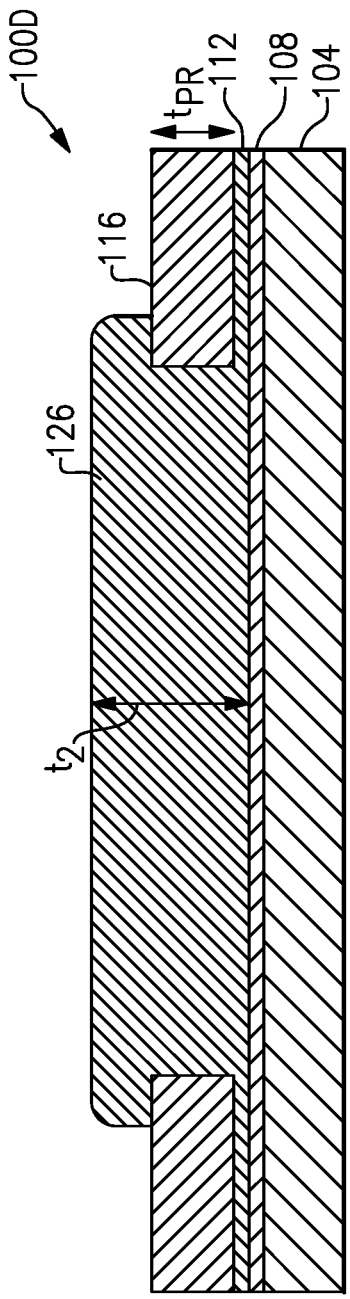

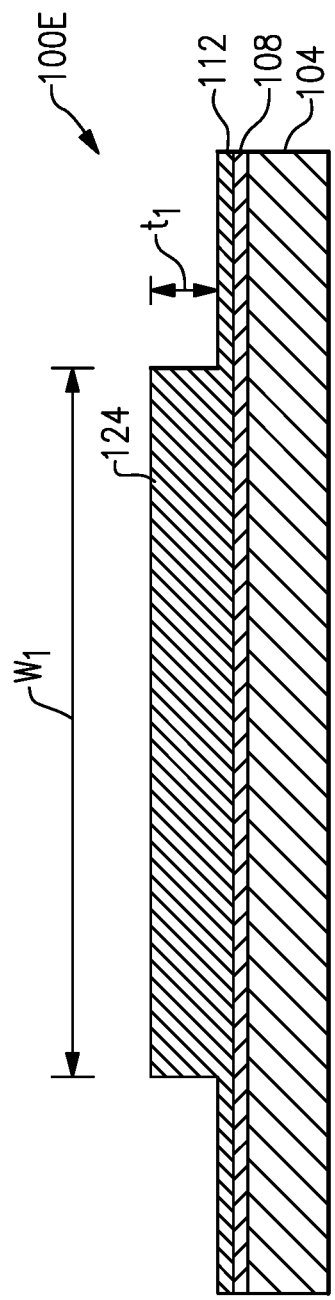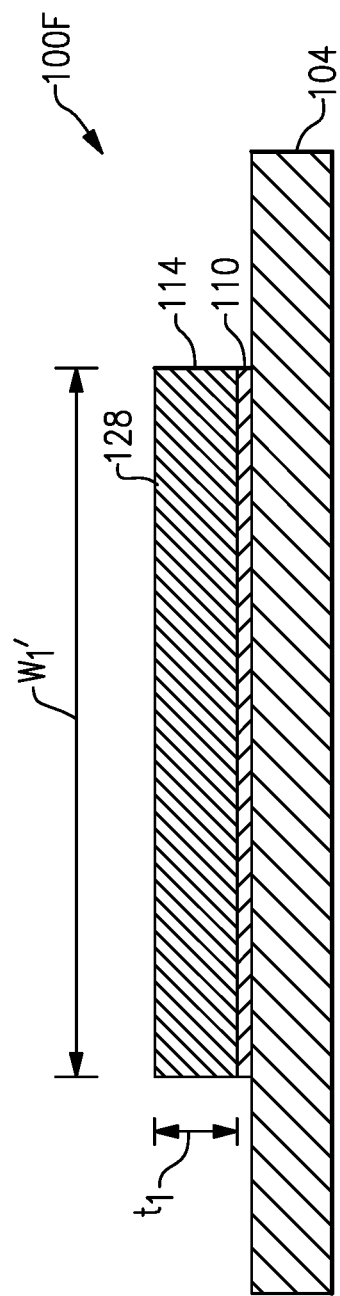

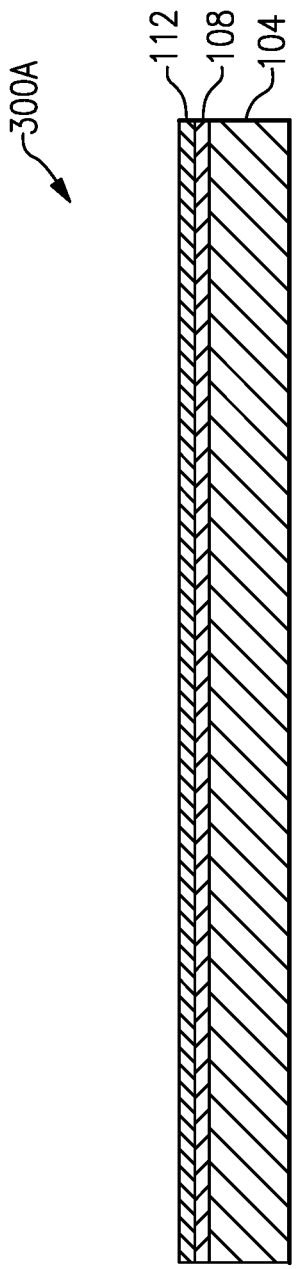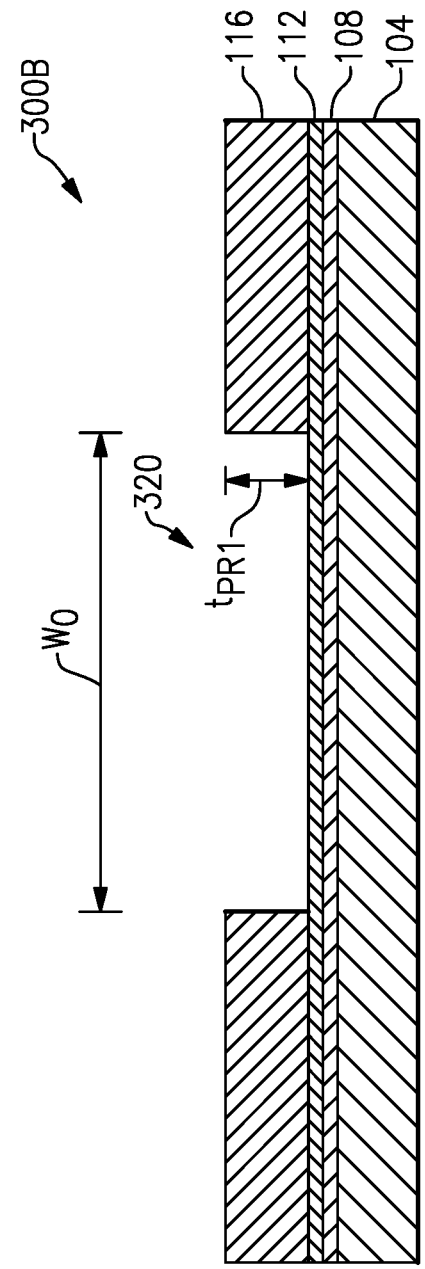

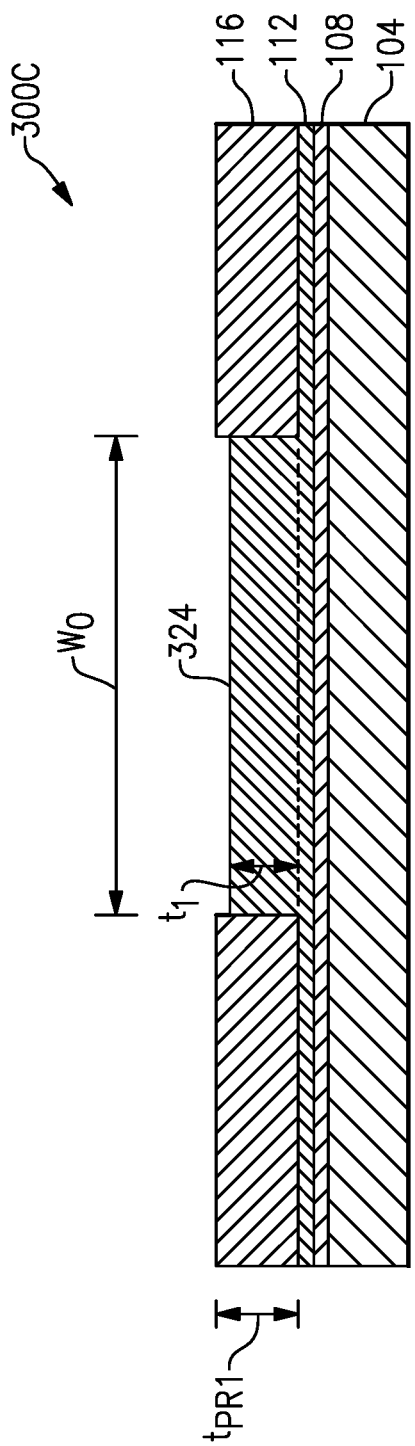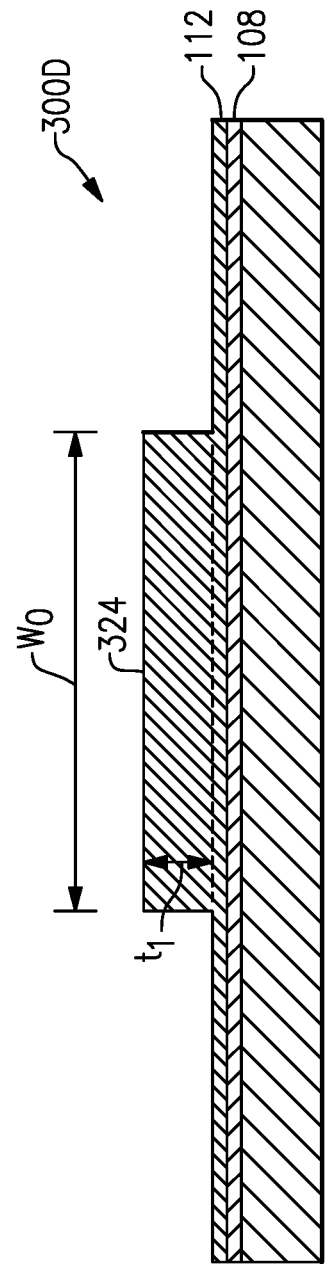

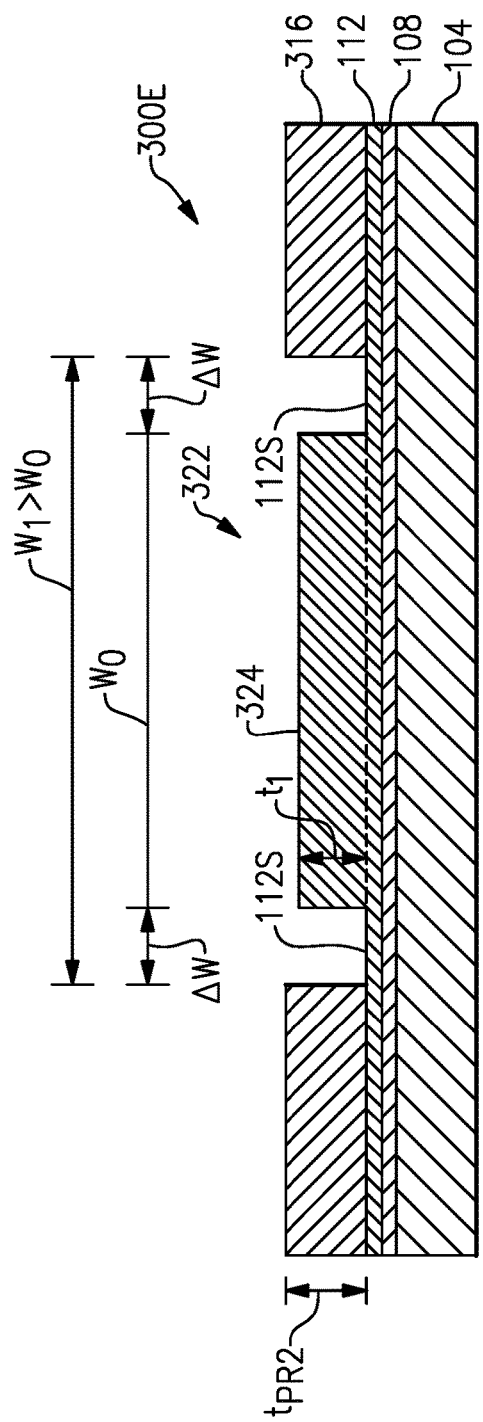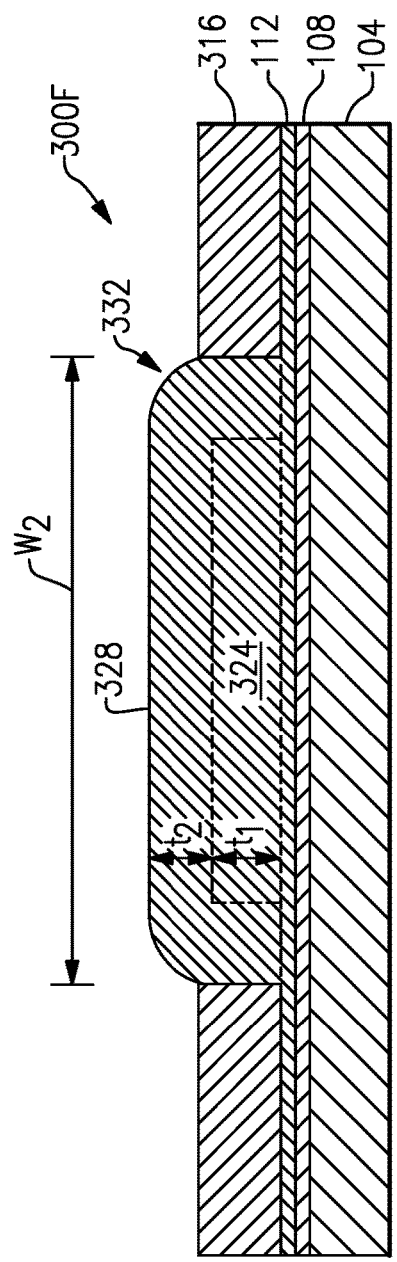

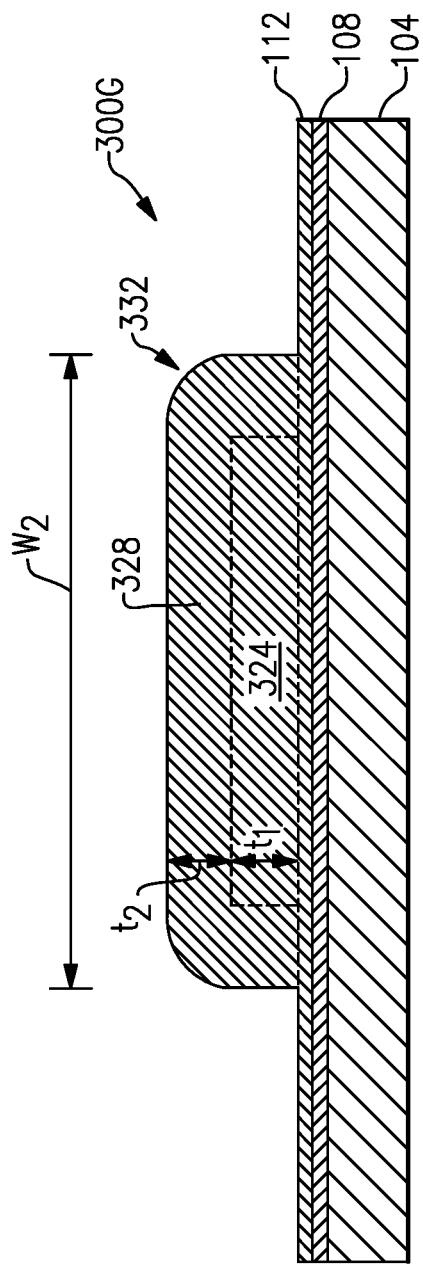
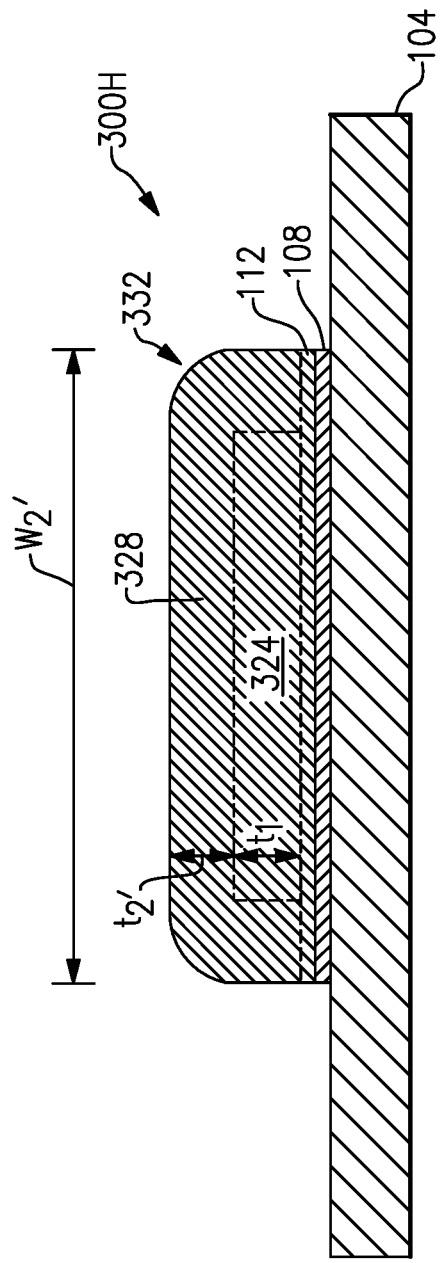

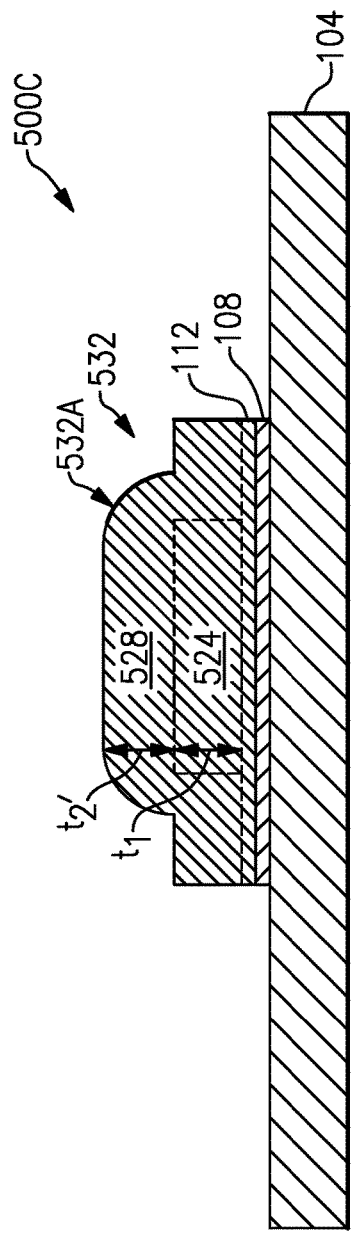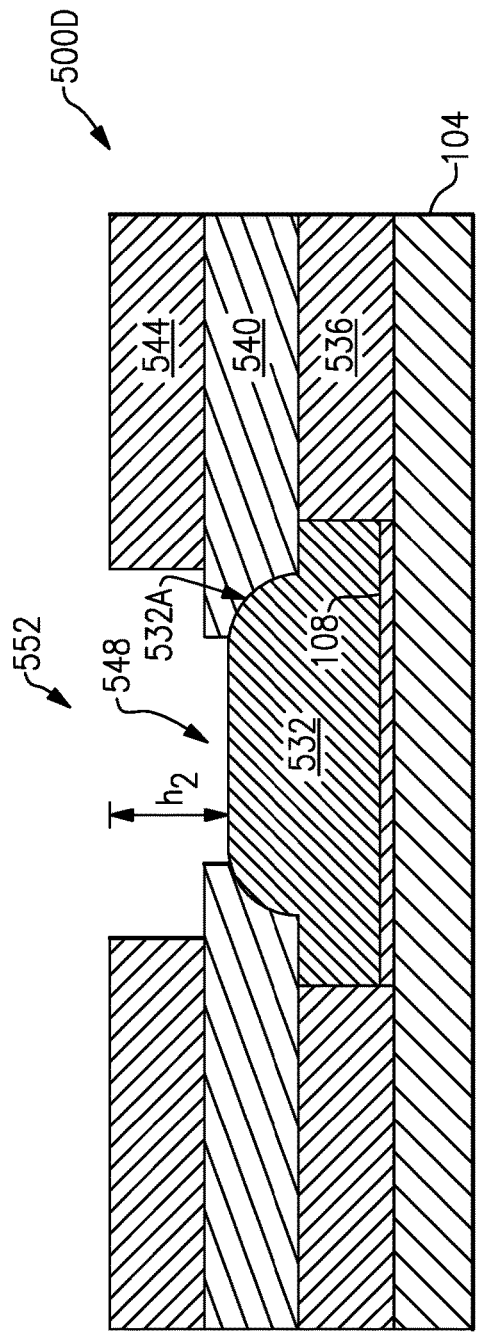
FIG.5C
FIG.5D

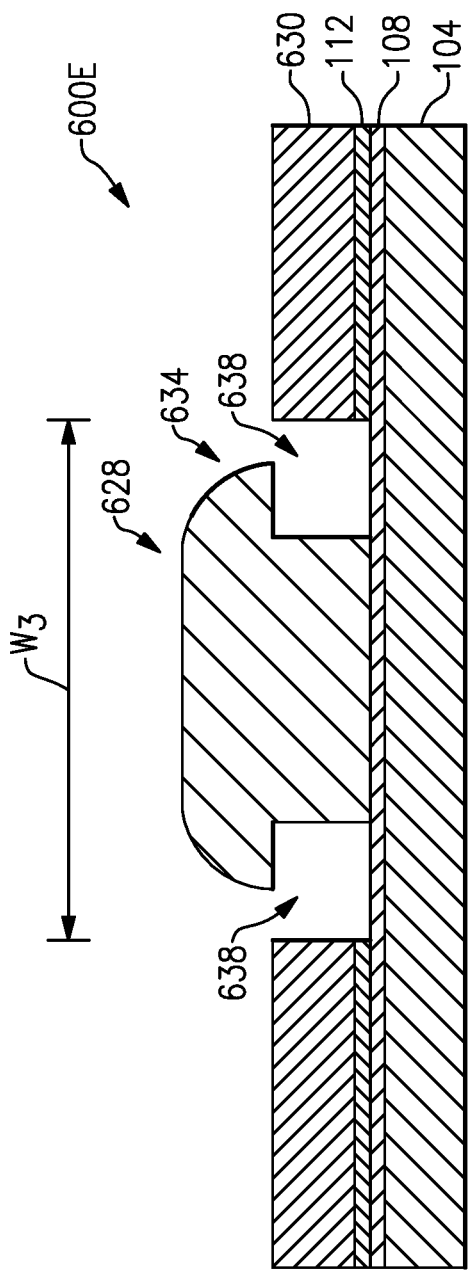
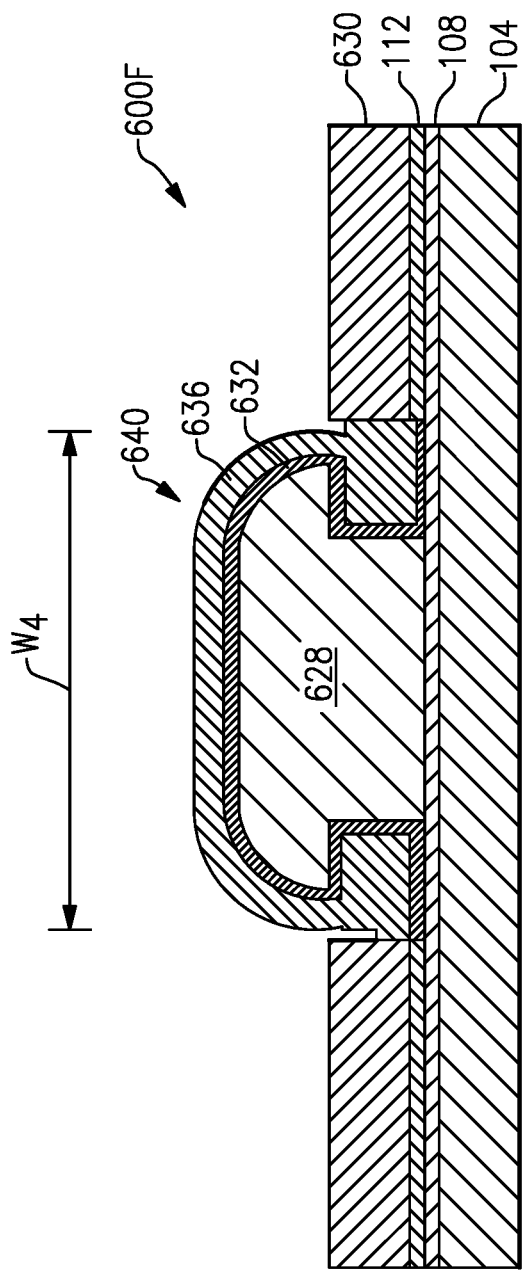

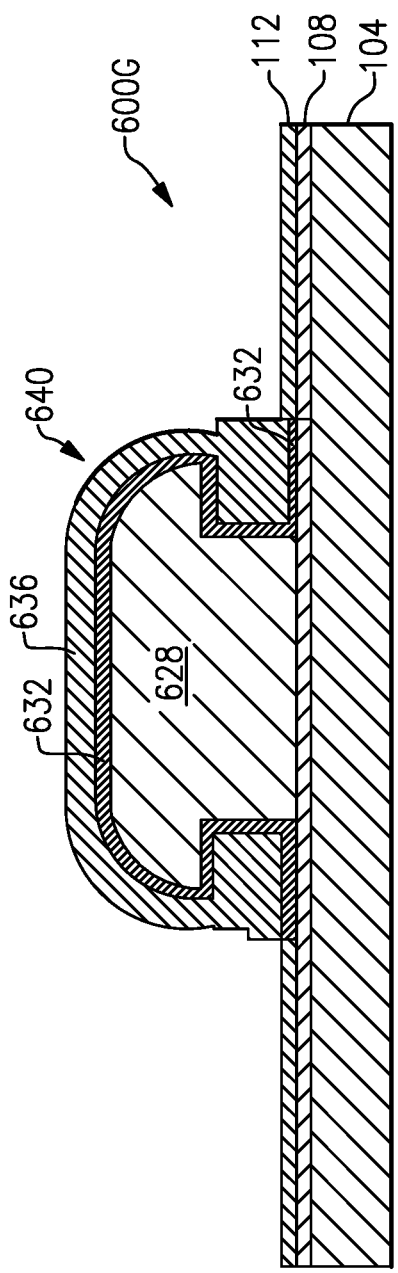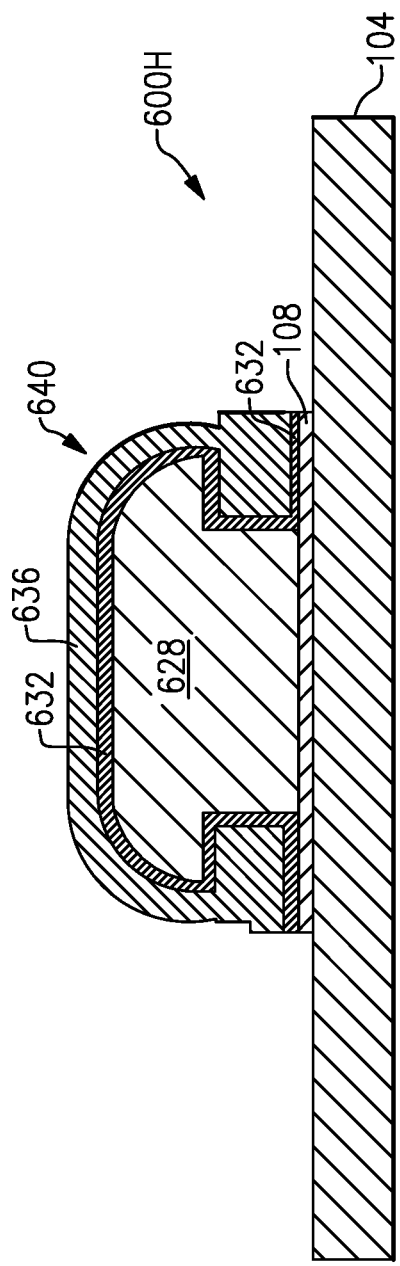

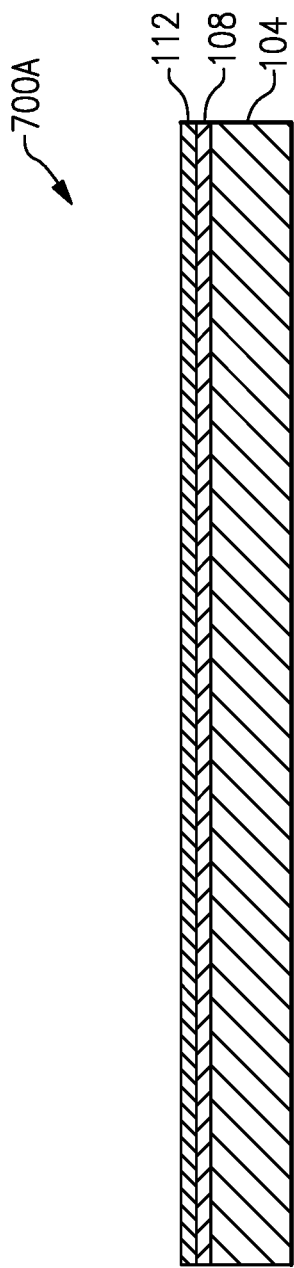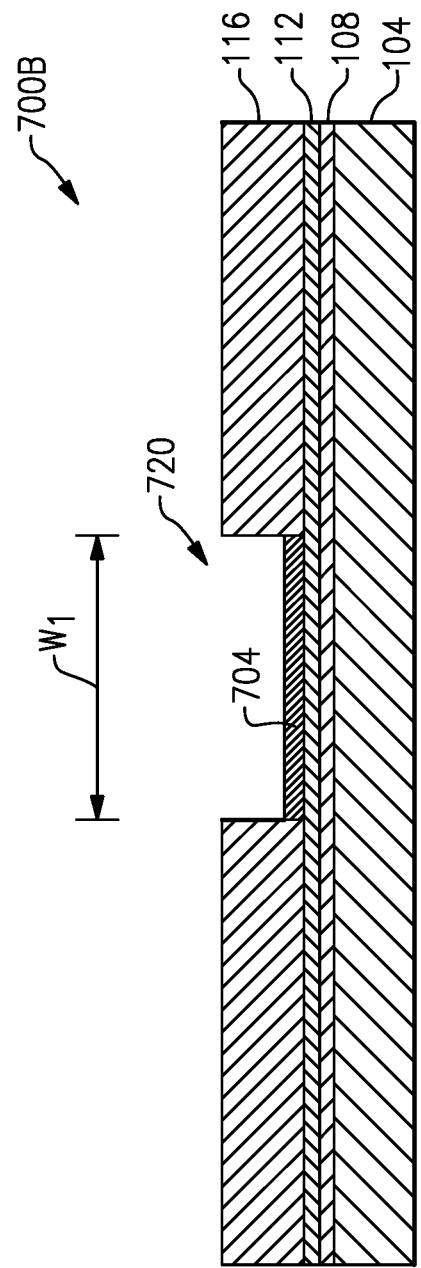
FIG. 7A
FIG. 7B

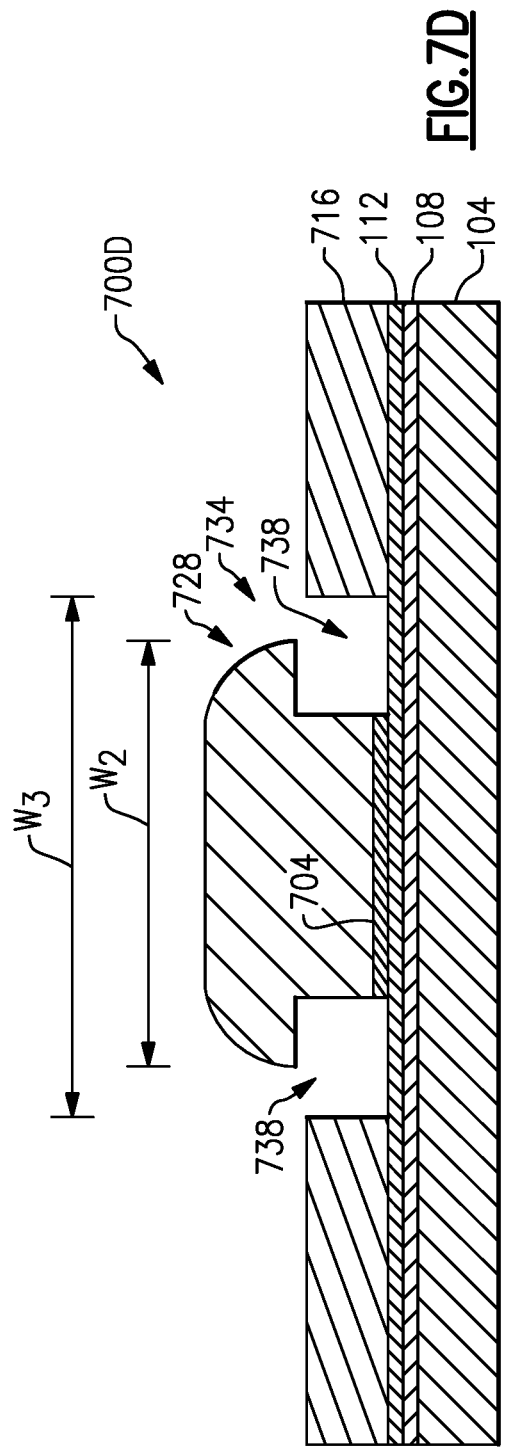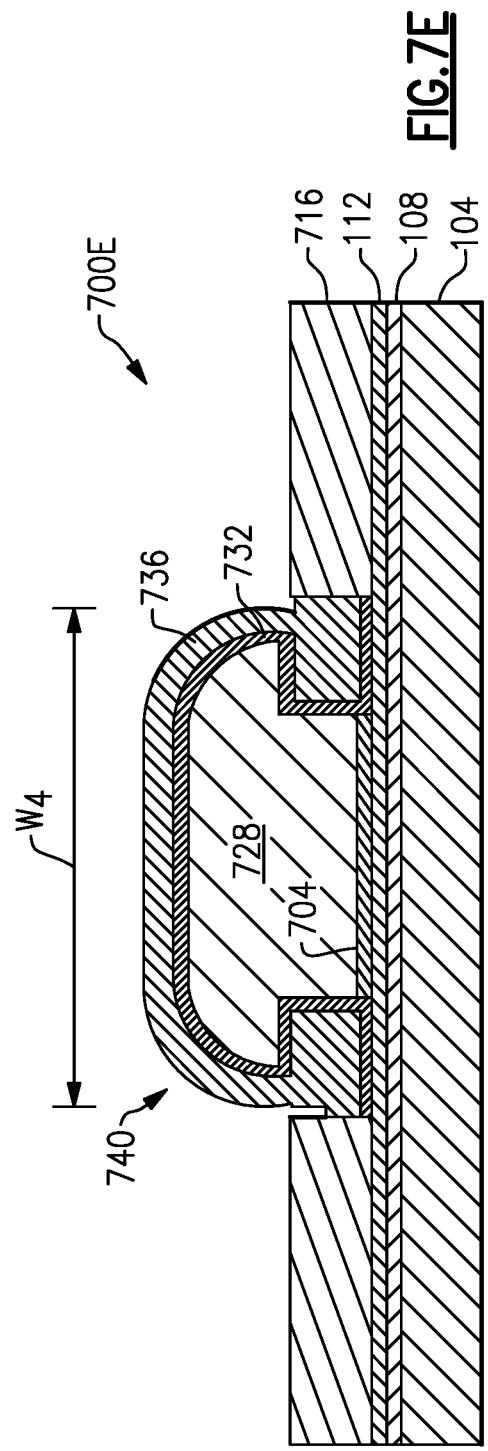

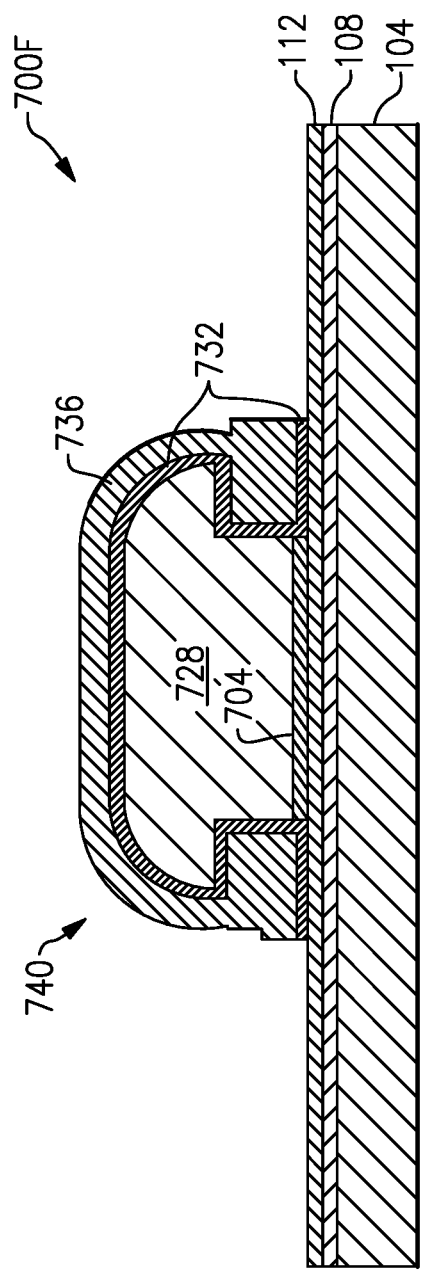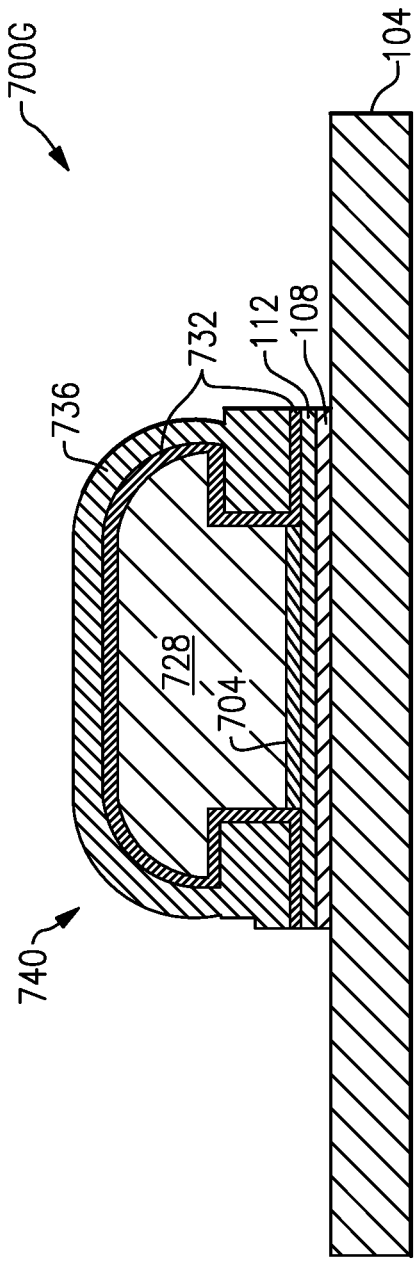

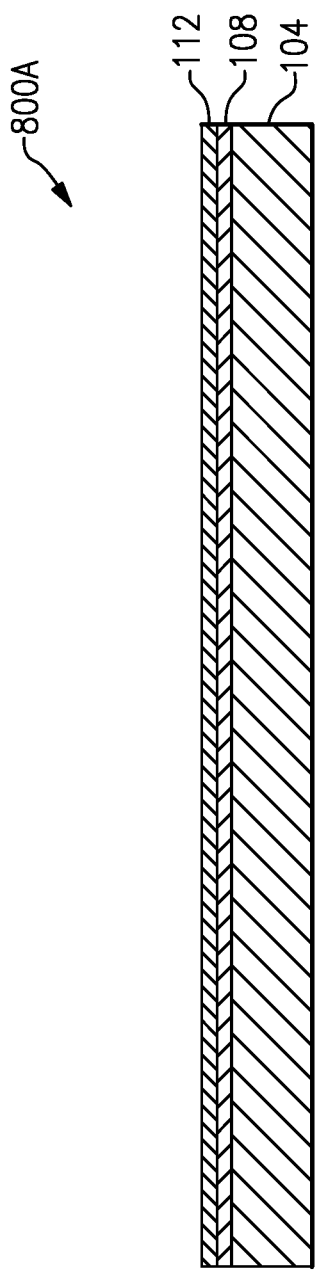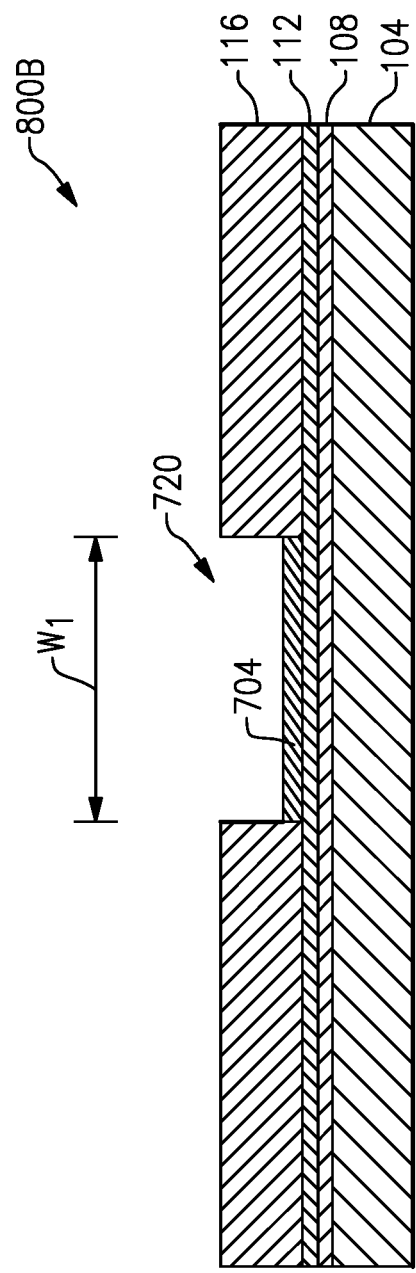

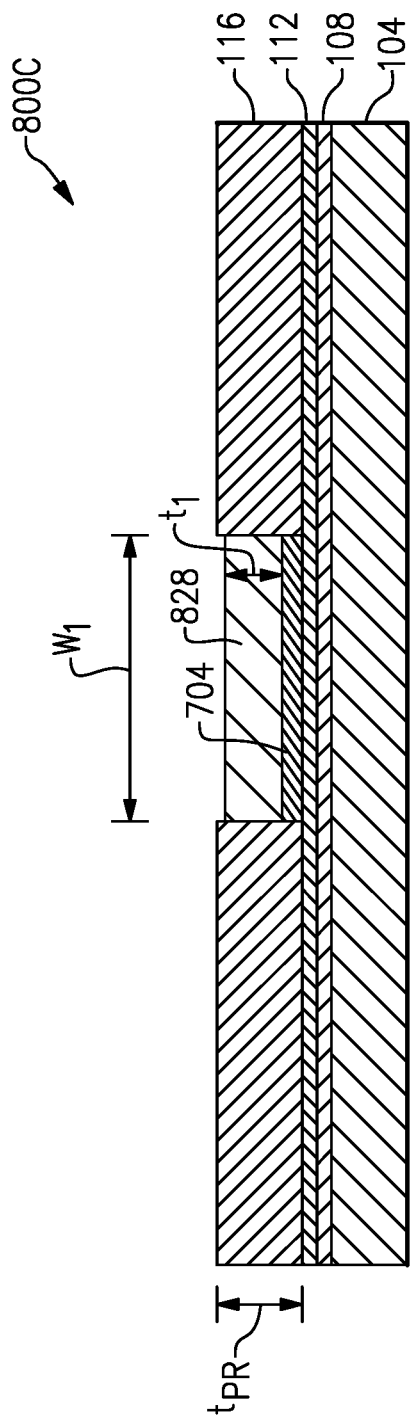

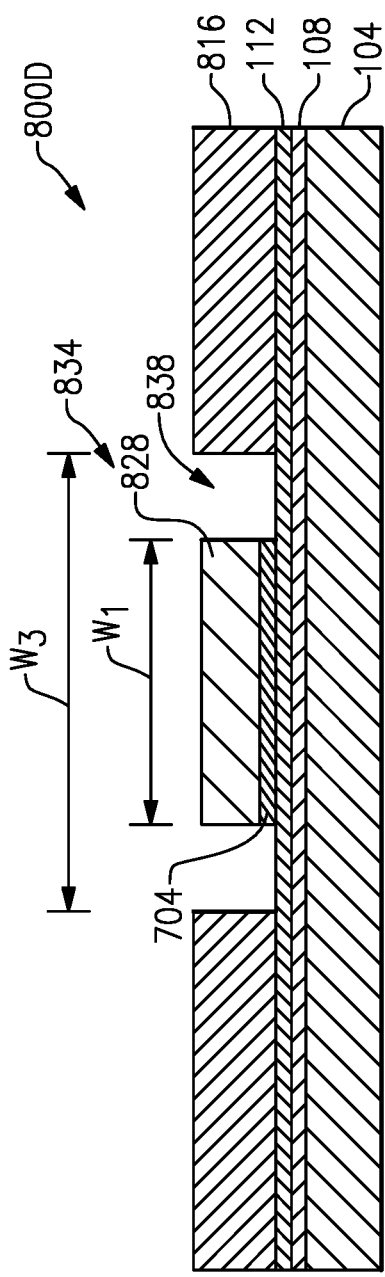
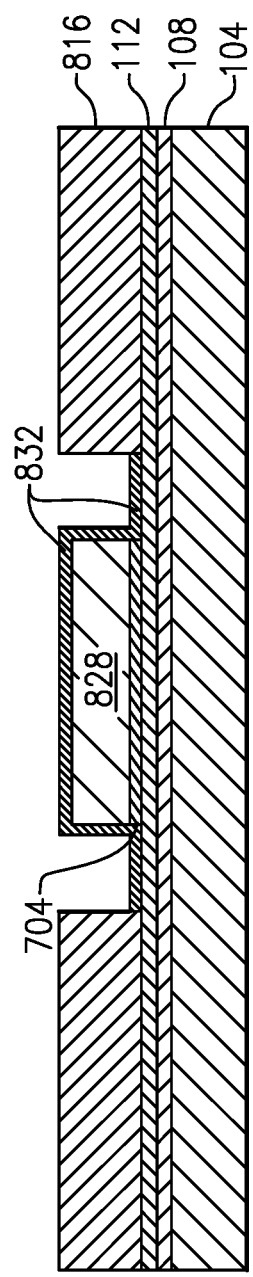
FIG.8D
FIG.8E

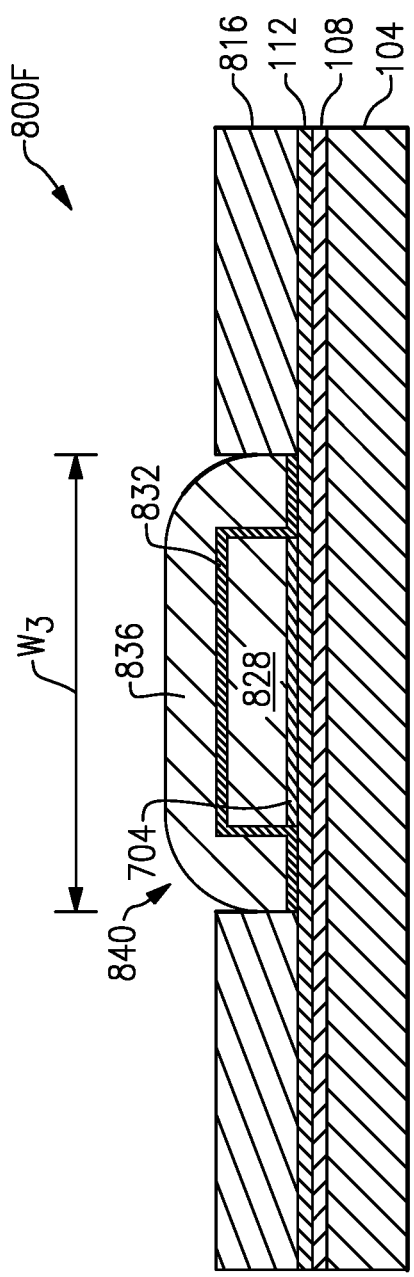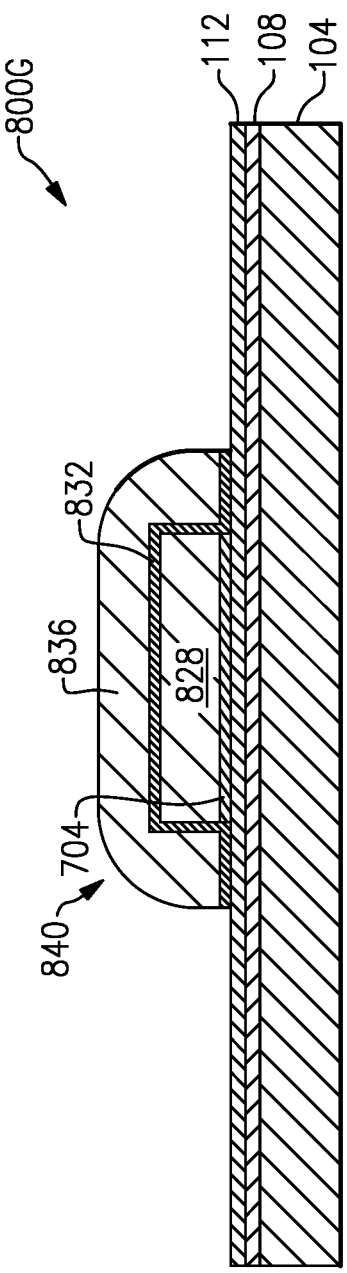

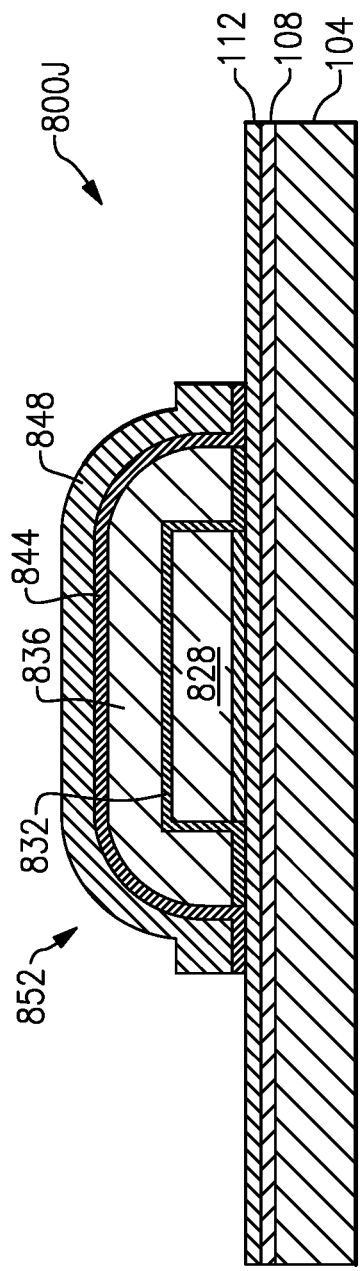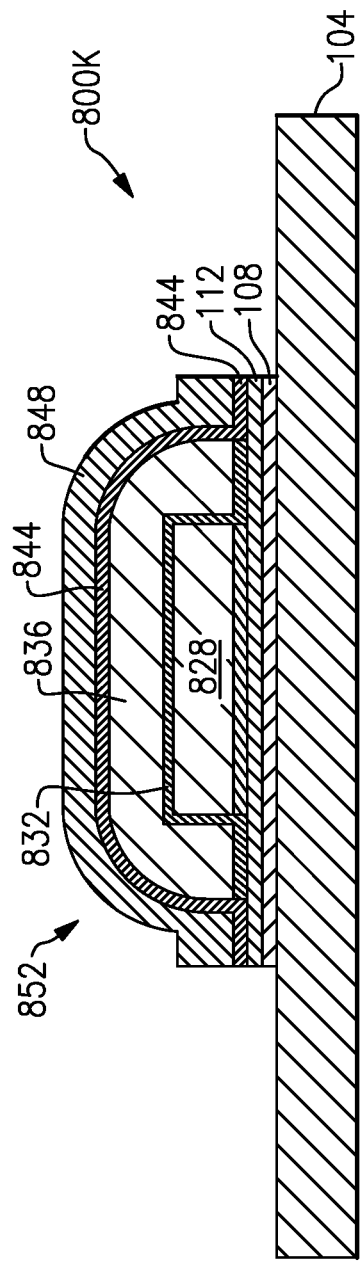

PLATED METALLIZATION STRUCTURES

CROSS-REFERENCE TO RELATED APPLICATIONS

This application is a divisional of U.S. application Ser. No. 15/810,836, filed Nov. 13, 2017, now U.S. Pat. No. 10,699,948, the content of which is incorporated herein by reference in its entirety.

FIELD OF THE DISCLOSURE

The disclosed technology generally relates to relatively thick metallization structures for integrated circuit devices, and more particularly to plating metallization structures through masking layers and resultant metallization structures.

BACKGROUND

Metallization structures constitute an integral part of many electronic devices and components. Some metallization structures serve as wiring that electrically interconnects active devices, such as transistors, while some other metallization structures serve as passive or active devices themselves, such as inductors, resistors or transformers. Some metallization structures can be formed as an integral part of an integrated circuit (IC) device, while other metallization structures can be formed as part of a package that houses the IC device and connects the IC device to the outside world.

Depending on the material of the conductors and the material of the dielectric surrounding the conductors, the metallization structures can be formed using various processes. For example, for interconnecting IC chips, metallization structures can be formed using printed circuit board (PCB) technology, co-fired ceramic technology or thin film integration technology, to name a few. Some thin film integration technologies integrate metal film structures with organic interlayer dielectric layers on rigid inorganic substrates such as silicon or aluminum nitride. Some thin film integration technologies can allow for integration of metallization structures at relatively higher density and higher performance compared to PCB and co-fired ceramic technology.

The thin film integration technology can in turn form the metallization structures using various methods, including subtractive etch, metal stencil lift-off, plating, and damascene methods, to name a few. In a subtractive etch process, a blanket film of metal, e.g., aluminum or gold, is deposited by sputtering or evaporation and subsequently photo-patterned with resist, followed by an etch process to form the metallization structures. In a metal stencil lift-off process, a pattern is first defined by photoresist, followed by a blanket deposition of metal layer(s) using evaporation or sputtering over the entire substrate. After the blanket metal deposition, the resist is lifted-off, leaving the metallization structures on the substrate. In some plating processes, a blanket deposition of a barrier layer and/or an adhesion when one or both are present and a seed layer is followed by photopatterning a masking layer or a patterning layer, e.g., photoresist or a photosensitive polyimide layer, to define areas in which a metal is subsequently electroplated. In a damascene process, conducting features are formed by first defining openings (e.g., trenches, vias) in a dielectric material, followed by backfilling the openings with a metal, then removing the excess metal by a planarization step. The adhesion, barrier and/or seed layer(s) may be under or over the dielectric material.

Challenges associated with integrating the thin-film materials and structures in forming the metallization structures by plating include forming metallization structures having relatively large thicknesses while ensuring high integrity and reliability of the final product and maintaining economic feasibility. Various structures and methods according to embodiments disclosed herein addresses these and other challenges associated with forming the metallization structures by plating, e.g., electroplating.

SUMMARY OF THE DISCLOSURE

In an aspect, a method of metallizing an integrated circuit device includes plating a first metal on a substrate in a first opening formed through a first masking layer, where the first opening defines a first region of the substrate. The method additionally includes plating a second metal on the substrate in a second opening formed through a second masking layer, where the second opening defines a second region of the substrate. The second opening is wider than the first opening and the second region encompasses the first region of the substrate.

In another aspect, an integrated circuit device includes a substrate and one or both of a first conductive barrier layer and a seed layer formed on the substrate. The integrated circuit device additionally includes a metallization structure comprising a first metal feature encapsulated by a second metal, where each of the first metal feature and the second metal contacts the first conductive barrier layer or the seed layer when present. The metallization structure has a thickness exceeding about 10 microns.

BRIEF DESCRIPTION OF THE DRAWINGS

FIG. 1C illustrates an intermediate structure, subsequent to the intermediate structure illustrated with respect to FIG. 1B, during fabrication of an electroplated metallization structure.

FIG. 1D illustrates an intermediate structure, subsequent to the intermediate structure illustrated with respect to FIG. 1C, during fabrication of an electroplated metallization structure.

FIG. 1E illustrates an intermediate structure, subsequent to the intermediate structure illustrated with respect to FIG. 1C during fabrication of an electroplated metallization structure.

FIG. 1F illustrates an intermediate structure, subsequent to the intermediate structure illustrated with respect to FIG. 1E, during fabrication of an electroplated metallization structure.

FIG. 3A illustrates an intermediate structure during fabrication of an electroplated metallization structure using masking layers, according to embodiments.

FIG. 3B illustrates an intermediate structure, subsequent to the intermediate structure illustrated with respect to FIG. 3A, according to embodiments.

FIG. 3C illustrates an intermediate structure, subsequent to the intermediate structure illustrated with respect to FIG. 3B, according to embodiments.

FIG. 3D illustrates an intermediate structure, subsequent to the intermediate structure illustrated with respect to FIG. 3C, according to embodiments.

FIG. 3E illustrates an intermediate structure, subsequent to the intermediate structure illustrated with respect to FIG. 3D, according to embodiments.

FIG. 3F illustrates an intermediate structure, subsequent to the intermediate structure illustrated with respect to FIG. 3E, according to embodiments.

FIG. 3G illustrates an intermediate structure, subsequent to the intermediate structure illustrated with respect to FIG. 3F, according to embodiments.

FIG. 3H illustrates an intermediate structure, subsequent to the intermediate structure illustrated with respect to FIG. 3G, according to embodiments.

FIG. 5C illustrates an intermediate structure, subsequent to the intermediate structure illustrated with respect to FIG. 5B, according to embodiments.

FIG. 5D illustrates an intermediate structure, subsequent to the intermediate structure illustrated with respect to FIG. 5C, according to embodiments.

FIG. 6E illustrates an intermediate structure, subsequent to the intermediate structure illustrated with respect to FIG. 6D, according to some embodiments.

FIG. 6F illustrates an intermediate structure, subsequent to the intermediate structure illustrated with respect to FIG. 6E, according to some embodiments.

FIG. 6G illustrates an intermediate structure, subsequent to the intermediate structure illustrated with respect to FIG. 6F, according to some embodiments.

FIG. 6H illustrates an intermediate structure, subsequent to the intermediate structure illustrated with respect to FIG. 6G, during fabrication of an encapsulated metallization structure, according to some embodiments.

FIG. 7A illustrates an intermediate structure during fabrication of an encapsulated metallization structure, according to some other embodiments.

FIG. 7B illustrates an intermediate structure, subsequent to the intermediate structure illustrated with respect to FIG. 7A, according to some other embodiments.

FIG. 7D illustrates an intermediate structure, subsequent to the intermediate structure illustrated with respect to FIG. 7C, according to some other embodiments.

FIG. 7E illustrates an intermediate structure, subsequent to the intermediate structure illustrated with respect to FIG. 7D, according to some other embodiments.

FIG. 7F illustrates an intermediate structure, subsequent to the intermediate structure illustrated with respect to FIG. 7E, according to some other embodiments.

FIG. 7G illustrates an intermediate structure, subsequent to the intermediate structure illustrated with respect to FIG. 7F, according to some other embodiments.

FIG. 8A illustrates an intermediate structure during fabrication of an encapsulated metallization structure, according to some other embodiments.

FIG. 8B illustrates an intermediate structure, subsequent to the intermediate structure illustrated with respect to FIG. 8A, according to some other embodiments.

FIG. 8C illustrates an intermediate structure, subsequent to the intermediate structure illustrated with respect to FIG. 8B, according to some other embodiments.

FIG. 8D illustrates an intermediate structure, subsequent to the intermediate structure illustrated with respect to FIG. 8C, according to some other embodiments.

FIG. 8E illustrates an intermediate structure, subsequent to the intermediate structure illustrated with respect to FIG. 8D, according to embodiments.

FIG. 8F illustrates an intermediate structure, subsequent to the intermediate structure illustrated with respect to FIG. 8E, according to some other embodiments.

FIG. 8G illustrates an intermediate structure, subsequent to the intermediate structure illustrated with respect to FIG. 8F, according to some other embodiments.

FIG. 8J illustrates an intermediate structure, subsequent to the intermediate structure illustrated with respect to FIG. 8I, according to some other embodiments.

FIG. 8K illustrates an intermediate structure, subsequent to the intermediate structure illustrated with respect to FIG. 8J, according to some other embodiments.

DETAILED DESCRIPTION

Some IC devices, e.g., inductors or transformers, or packaging for IC devices, include relatively thick metallization structures, whose thicknesses are designed, e.g., to reduce parasitic resistance. However, metallization structures formed by plating are sometimes limited by the thickness of the masking layer, e.g., photoresist, used to define them. For example, photoresist can have a limited thickness in commercially available formulations, and other limits on photoresist thickness relate to the ability to define vertical walls through irradiation for the desired dimensional control. When a metallization structure is formed by plating in an opening formed through a photoresist layer, plating to a thickness greater than the photoresist layer can lead to what is sometimes referred to as "breadloafing," which refers to a phenomenon in which the metal that is electroplated in excess of filling the opening grows or electrodeposits laterally as well as vertically, which then deviates from the desired lateral geometry and can cause various defects, including electrical shorts and nonplanarity. For these reasons, electroplated metallization structures are generally electroplated to a thickness comparable to or less than the photoresist used to define the electroplated areas. In the following, with respect to FIG. 1A-1F, an example method of forming electroplated metallization structures is described, in which, to prevent formation of a bread loaf structure, the thickness of the metallization structures is kept at or below that of the photoresist. Subsequently, various methods according to embodiments are described, which can advantageously overcome some of the problems associated with plating metallization structures that are thicker than masking layers used to define them. In various examples and embodiments described herein, plating may be performed electrolytically (e.g., electroplating) or electrolessly (e.g., chemical plating), depending on various factors, including what the deposit will be used for, configuration of the part, materials compatibility and cost of processing.

FIGS. 1A-1F illustrate intermediate structures 100A-100F, respectively, at various stages of fabrication of an electroplated metallization structure on a substrate 104, according to some example processes. Referring to the intermediate structure 100A of FIG. 1A, prior to plating, an adhesion layer and/or an electrically conductive barrier layer 108 is formed on the substrate 104, followed by formation of a seed layer 112.

Figure 1A:
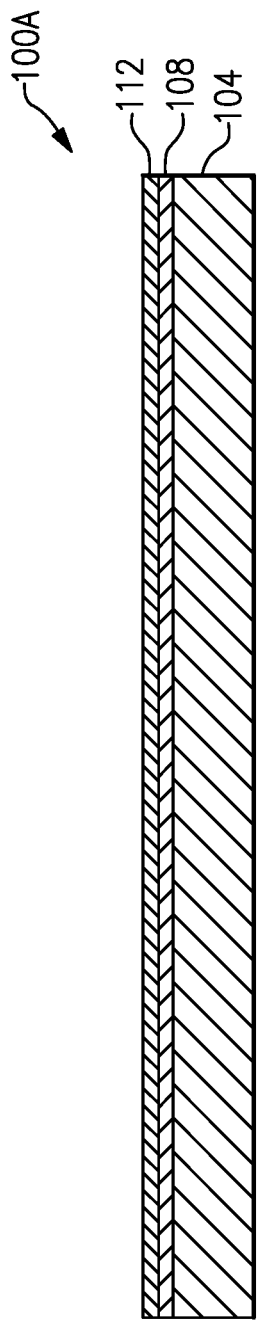
FIG. 1A schematically illustrates a cross section of an intermediate structure during fabrication of an electroplated metallization structure.
Figure 1B:
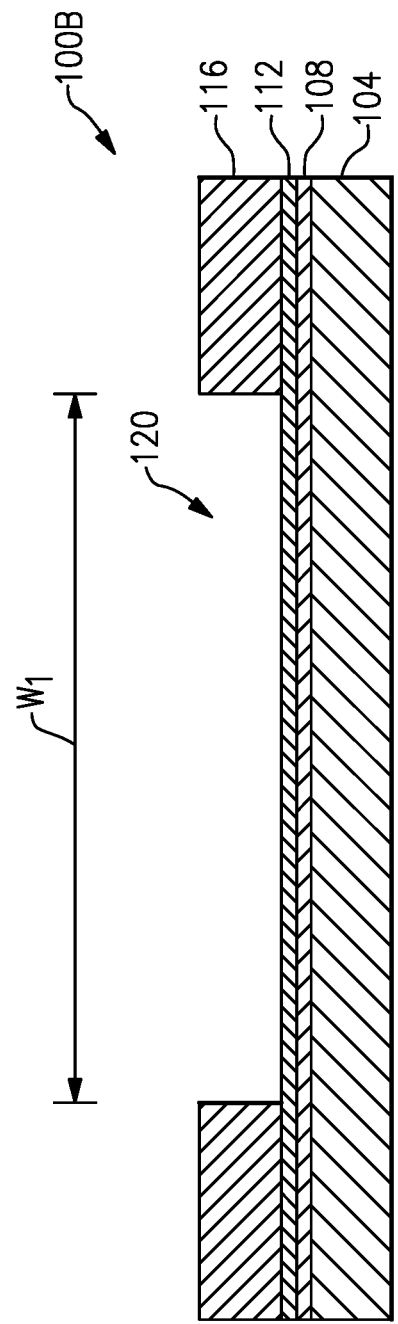
FIG. 1B illustrates an intermediate structure, subsequent to the intermediate structure illustrated with respect to FIG. 1A, during fabrication of an electroplated metallization structure.

Referring to FIG. 1B, after formation of the seed layer 112, with or without underlying adhesion and/or conductive barrier layer 108, a masking layer 116 is formed on the substrate 104 to define a pattern which exposes areas in which the metal feature 124 is subsequently electroplated (FIG. 1C). The masking layer may be an organic resist material, particularly photosensitive resist.

Referring to FIG. 1C, after exposing and developing the masking layer 116 to form the pattern including the opening 120, a metallization feature 124 having the width $W_1$ is formed in the opening 120 by plating on the exposed seed layer 112 (illustrated). The metallization layer 124 may include a suitable material, e.g., gold and/or copper, depending on the technology.

Still referring to FIG. 1C, in the illustrated example, the metal feature 124 has a target thickness $t_1$ that is about the same or thinner than the thickness $t_{PR}$ of the masking layer 116. Under this circumstance, because the metal feature 124 is electroplated selectively in the opening 120, so long as the $t_1$ is about the same or smaller than the $t_{PR}$, the metal feature 124 is contained substantially in the opening 120 vertically and laterally. Having the $t_1$ about equal or less than the $t_{PR}$ may be advantageous, e.g., for reasons described below with respect to FIG. 1D, including preventing electrical shorts.

In the intermediate structure 100D illustrated with respect to FIG. 1D, unlike the metal feature 124 of the intermediate structure 100C illustrated with respect to FIG. 1C, the metal feature 126 is overplated to a thickness $t_2$ exceeding $t_{PR}$. For example, the metal feature 126 may be overplated to $t_2$ of about 16 microns, while a commercially available photoresist may have a thickness of about 10 microns. When this occurs, as illustrated, a portion of the overplated metal feature 126 above the surface of the masking layer 116 grows or electrodeposits laterally beyond the width $W_1$ defined by the opening 120. Such phenomenon is sometimes referred to as "bread loafing." While the overplated metal feature 124 may provide a thickness $t_2$ greater than the $t_{PR}$, the resulting bread loaf structure can cause various problems. For example, the lateral dimensions of the overplated feature 126 may be difficult to control accurately. In addition, bread loaf structure may cause portions of the masking layer 116 under the laterally overgrown overhang region to be incompletely removed. Thus, the bread loafing of FIG. 1D is typically avoided in the art.

Referring to FIG. 1E, after plating the metallization layer 124 having the width $W_1$ to the thickness $t_1$ in the illustrated intermediate structure 100C of FIG. 1C (or to the overplated thickness $t_2$ in the intermediate structure 100D of FIG. 1D), the masking layer 116 is removed or stripped using a suitable wet and/or dry process.

Referring to FIG. 1F, after removing the masking layer 116, e.g., by dissolving or ashing, the exposed seed layer 112 and any adhesion and/or conductive barrier layer 108 are removed from locations previously covered by the masking layer 116 (FIG. 1C). The seed layer 112, adhesion layer and/or the conductive barrier layer 108 may be removed by etching, e.g., by wet etching or dry etching, which may cause some of the material of the metal feature 124 to be also removed for some etch chemistries, thereby forming the resulting final metal feature 128. Because the thicknesses of the seed layer 112, adhesion layer and/or the conductive barrier layer 108 are relatively small compared to the thickness of the metal feature 124 (FIG. 1E), the final metal feature 128 has a thickness $t_1'$ that may be substantially the same as the thickness $t_1$ of the metal feature 124 (FIG. 1E) prior to the removal of the exposed seed layer 112 and/or the conductive barrier layer 108 (FIG. 1F). For example, even if the etch chemistry is relatively non-selective and isotropic, the $t_1'$ may approximately be the $t_1$ less the amount of the metallization layer 124 that is removed during the removal of the exposed seed layer 112 and/or the conductive barrier layer 108.

Still referring to FIG. 1F, because the metal feature 124 (FIG. 1E) was formed within the opening 120 having the width $W_1$ defined by the masking layer 116 (FIG. 1B), upon removal of the masking layer 116, the metal feature 124 (FIG. 1E) has substantially the same width $W_1$ as the opening 120. In addition, because any amount of the metal feature 124 removed during the removal of the seed layer 112, adhesion layer and/or the conductive barrier layer 108 is relatively small, the final metal feature 128 has substantially the same width $W_1'$ as the $W_1$ of the metal feature 124 prior to the removal of the seed layer 112, adhesion layer and/or the conductive barrier layer 108. Thus, in the example illustrated with respect to FIGS. 1A-1F, the width $W_1$ of the opening 120 formed by the masking layers 116 has substantially the same width as the target width $W_1'$ of the final metal feature 128.

Based on the foregoing, ways to achieve higher $t_1$ include overplating or increasing the $t_{PR}$. However, as described above with respect to FIG. 1D, when overplated to have a thickness $t_2$ substantially exceeding the thickness of the masking layer $t_{PR}$, the resulting metal feature 126 having the bread loaf structure may lead to undesirable defects, e.g., electrical shorting of the metallization layers 126 and/or difficulty in removal of the masking layers. In addition, increasing the $t_{PR}$ to avoid a bread loaf structure also not be practical or desirable under manufacturing constraints, for reasons described below.

When the target thickness of the metal feature 124 illustrated in FIG. 1C needs to be substantially thicker than the $t_{PR}$, e.g., to achieve lower electrical resistance, the thickness of the metal feature 124 that is contained substantially in the opening 120 vertically and laterally as described above with respect to FIG. 1C may not be sufficient. However, according to examples and embodiments disclosed herein including the example process described above with respect to FIGS. 1A-1F, the masking layer 116 may be designed, e.g., by a manufacturer and/or for the application process, to be used within a specified range of thicknesses $t_{PR}$ for optimized manufacturability. The specified range of thicknesses may depend on factors such as, e.g., spinning speed during spin coating, depth of focus of light used for patterning, removal of solvent and mechanical stability, among various other factors. When used outside of the specified range of thicknesses, the masking layer 116 may undesirably cause various issues in manufacturing, e.g., insufficient or nonuniform exposure at different thickness of the masking layer 116, inability to get vertical sidewalls, which may in turn lead to metallization structures whose shape or size deviate significantly from the intended shape or size.

Figure 2:
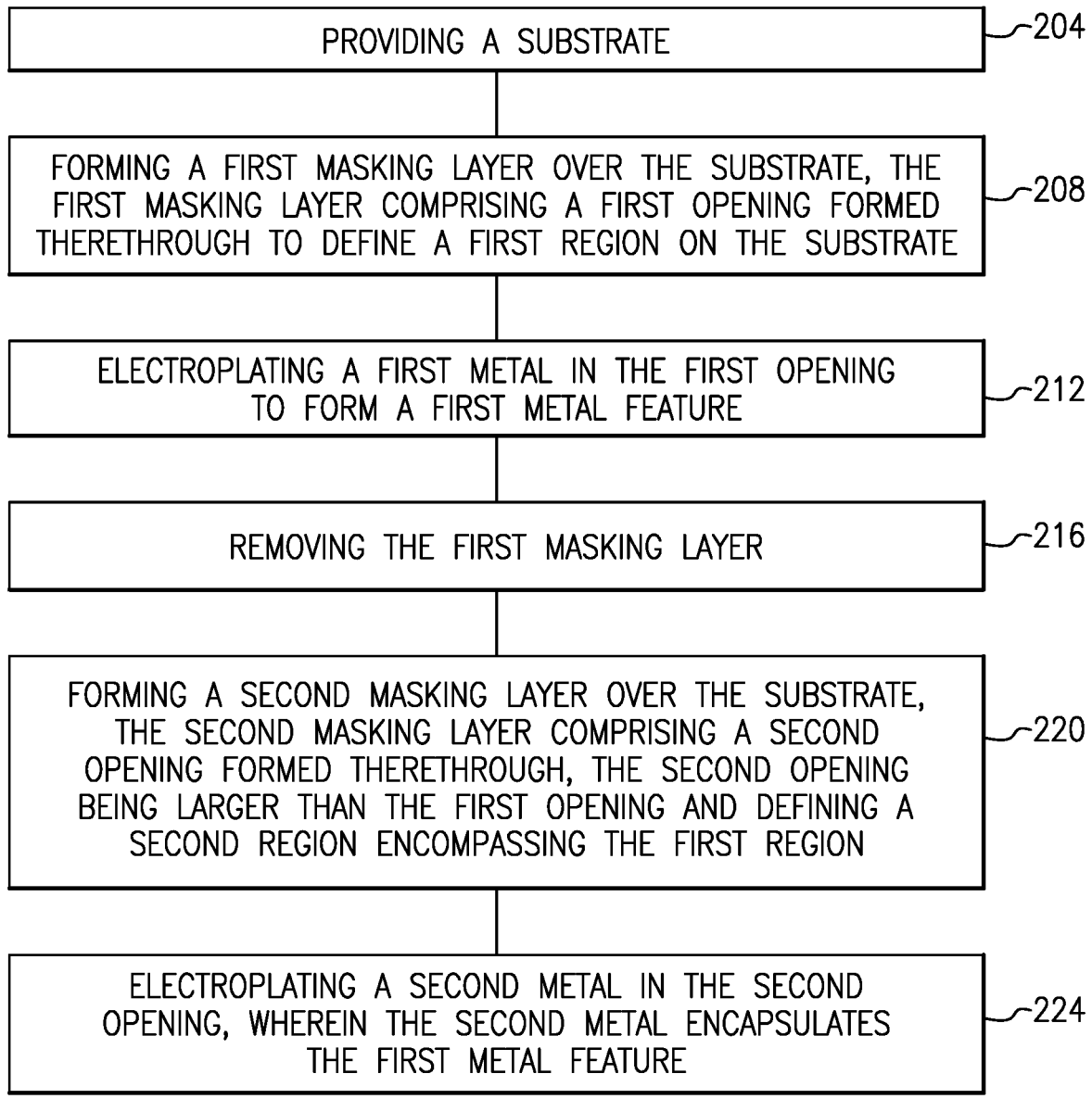
FIG. 2 is a flow chart illustrating a method of forming a metallization structure using masking layers, according to embodiments.

To address these and other undesirable effects of forming metal features having a thickness substantially greater than that of the masking layer, various methods according to embodiments described herein form electroplated metallization structures that are substantially thicker than the thickness of the masking layer. One example method is described with respect to FIG. 2, which describes a method 200 of forming a relatively thick metal structure by plating, according to various embodiments. The method 200 includes providing 204 a substrate. The method includes forming 208 a first patterning layer over the substrate, including forming a first opening therethrough. A schematic example of the resulting intermediate structure is described infra, e.g., with respect to FIG. 3B. The first opening may be formed, e.g., lithographically using a first optical mask or reticle configured to expose a portion of the first masking layer, also referred to herein as the first patterning layer, to form the first opening. The first opening defines a first region on the substrate. The method 200 additionally includes plating 212 a first metal in the first opening to form a first metal feature and removing 216 the first masking layer. A schematic example of the resulting intermediate structure is illustrated infra with respect to, e.g., FIG. 3D. The method additionally includes forming 220 a second masking layer, also referred to herein as the second patterning layer, over the substrate, where the second masking layer includes a second opening formed therethrough. The second opening is larger than the first opening and encompasses the first region of the substrate defined by of the first opening. The second opening may be formed, e.g., lithographically using a second optical mask configured to expose a portion of the second masking layer to form the second opening larger than the first opening. The second opening defines a second region on the substrate which encompasses the first region of the substrate defined by the first opening. Schematic examples of the resulting structures are illustrated in FIGS. 3E, 5A, 6E, 7D, and 8D, described in detail infra. The method additionally includes plating 224 a second metal in the second opening, wherein the second metal is electroplated on the first metal feature to form a metallization structure at a single metallization level. The second metal encapsulates the first metal feature such that the second metal comprises a portion formed on the first metallization structure and a portion that laterally extends outside of the first metal feature. Schematic examples of the resulting structures are illustrated in FIGS. 3H, 5C, 6H, 7G and 8G or 8K, described in detail infra. Various features and intermediate structures that embody the method 200 can be used to form various metallization structures, including thick metallization structures (e.g., FIGS. 3A-3H), raised metallization structures for reducing the step height for subsequent overlying via (e.g., FIGS. 5A-5F) and encapsulated metallization structures (e.g., FIGS. 6A-6G; FIGS. 7A-7F; and FIGS. 8A-8K).

Thick Electroplated Metallization Structures Formed Using Masking Layers Thinner than the Thick Metal Structure As described herein, electrolytic plating or electroplating refers to a process that uses electric current to reduce dissolved metal cations and electrodepositing or forming a thin metal coating therefrom on a substrate serving as an electrode. The electrodeposition process in electrolytic plating or electroplating can be analogous to a galvanic cell acting in reverse. In some processes, the substrate to be plated serves as the cathode of a circuit, while an anode contains or is formed of the metal to be plated on the substrate. Both components are immersed in a solution called an electrolyte containing one or more dissolved metal salts as well as other ions that permit the flow of electricity. A power supply supplies a current to the anode, oxidizing the metal atoms that it comprises and allowing them to dissolve in the solution. At the cathode, the dissolved metal ions in the electrolyte solution are reduced at the interface between the solution and the cathode, such that they "plate out" onto the substrate serving as the cathode. A rate at which the anode is dissolved may be substantially equal to the rate at which the cathode is plated, vis-a-vis the current through the circuit. In this manner, the ions in the electrolyte bath are continuously replenished by the anode.

Plating as described herein is not limited to electroplating. As described herein, plating in various examples or embodiments can be electrolytic or electroless. Unlike electrolytic plating or electroplating described above, an electroless deposition process uses one electrode without an external source of electric current. However, the solution for the electroless process contains a reducing agent so that metal cations are reduced to elemental solid metal on the substrate surface. For example, electroless plating or chemical plating of silver, gold and copper can use a reducing agent such as low molecular weight aldehydes.

FIGS. 3A-3H illustrate a method of plating a metallization structure, according to various embodiments. As noted, the method is useful in forming thick metal layers for reduced resistivity, particularly where the thickness is greater than the thicknesses of masking layers used to define the metallization structure. Examples of applications for this embodiment and the embodiments described below include, without limitations, conductors for forming inductors or transformers, such as for isocouplers.

FIG. 3A illustrates an intermediate structure 300A comprising a substrate 104 having formed thereon a seed layer 112 with or without underlying adhesion and/or conductive barrier layer 108, similar to the intermediate structure 100A described above with respect to FIG. 1A. The barrier layer 108 can serve as an adhesion layer, can be replaced by an adhesion layer, or an additional adhesion layer can be provided below the barrier layer 108.

As described herein and throughout the specification, it will be appreciated that the substrate 104 on which metallization structures are formed can be implemented in a variety of materials, including, but not limited to, a semiconductor substrate, e.g., doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials. The substrate 104 may also be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer. In addition, it will be appreciated that the various structures described herein can be at least partially formed in an epitaxial layer formed at or near a surface region.

According to some embodiments, the substrate 104 may be implemented as an insulating material such as a ceramic or a glass material. For example, the substrate 104 may be implemented as an aluminum-based material, such aluminum oxide (e.g., $Al_2O_3$) and/or aluminum nitride (AlN). However, embodiments are not so limited, and the substrate 104 can be formed of other materials, e.g., ceramics such as BeO, silicon carbide (SiC), silicon nitride ($Si_3N_4$), low temperature co-fired ceramic (LTCC) substrates, silicon dioxide ($SiO_2$), zirconia ($ZrO_2$) and ferrites, to name a few.

According to yet some other embodiments, the substrate 104 may be implemented as a polymeric or a composite material, such as that used in printed circuit boards (PCBs). For example, the substrate 104 may comprise phenolic paper, phenolic cotton paper, paper impregnated with a phenol formaldehyde resin, a woven fiberglass cloth impregnated with an epoxy resin, polyimide and polyimide-fluoropolymer, to name a few.

According to some embodiments, on the substrate 104, an adhesion layer (not shown) and/or the electrically conductive barrier layer 108 when present and the seed layer 112 may be formed, in a similar manner as described above with respect to FIG. 1A. When present, the conductive barrier layer 108 may serve to inhibit or retard diffusion or interdiffusion of atoms therethrough between layers formed above and below the conductive barrier layer 108. For example, a conductive barrier layer 108 formed of, e.g., TiW or NiMn, can suppress diffusion of metal atoms into the substrate 104. The diffusion of metal atoms into the substrate 104 may cause various undesirable results including, e.g., electrical shorts and/or degradation of characteristics of devices that may be formed in the substrate 104. For example, metal diffusion may cause increased leakage current in semiconductor devices that may be formed in the substrate 104 formed of a semiconductor. Such barrier materials may also serve to improve adhesion to the insulators. According to various embodiments, the conductive barrier layer 108 may include of one or more of titanium (Ti), tantalum (Ta), tungsten (W) and nickel (Ni) and compounds thereof, alloys (e.g., titanium tungsten (TiW)), and compounds thereof, such as metal carbides or metal nitrides (e.g., titanium nitride (TiN), tungsten nitride (WN) and titanium nitride (TiN)), to name a few.

Also as described above, the seed layer 112 may be a thin conductive layer which serves as nucleation layer for the subsequently electroplated first metal of the first metal feature 324 (FIG. 3C). According to some embodiments, the seed layer 112 may include or be formed of the same material as the subsequently electroplated first metal feature 324 (FIG. 3C). When formed of the same metal, the seed layer 112 may serve as a nucleation layer, e.g., a homogeneous nucleation layer, for subsequent growth of the metal during plating of the metallization feature 324 (FIG. 3C). For example, when the subsequently electroplated first metal feature 324 comprises or is formed of gold, the seed layer 112 may also comprise or be formed of gold. Likewise, when the subsequently electroplated first metal feature 324 is formed of copper, the seed layer 112 may also comprise or be formed of copper. However, embodiments are not so limited, and the seed layer 112 may comprise or be formed of a metal different from the subsequently plated first metal feature 324 (FIG. 3C), such that the seed layer 112 serves as a nucleation layer, e.g., a heterogeneous nucleation layer, for the subsequently electroplated first metal feature 324. For example, the seed layer 112 may be formed of chromium (Cr), which can serve as a heterogeneous nucleation layer for subsequent growth of gold thereon during plating of the first metal feature 324 formed of gold or copper. Typically, the seed layer 112 extends across the substrate to facilitate electrical connection to a cathode (for electrolytic plating), but can later be removed from outside the feature of interest (see, e.g., FIG. 3H).

In FIGS. 3A-3H and for the corresponding layers in other embodiments described herein below, each of the conductive barrier layer 108, the seed layer 112 and the adhesion layer (not shown) can have a thickness of about less than 100 nm, 100 nm, 200 nm, 500 nm, 1000 nm or a thickness in a range defined by any of these values.

As noted, in addition to serving as a diffusion barrier and a nucleation layer, the conductive barrier layer 108 and the seed layer 112 also may serve to promote adhesion of the first metal feature 324 to the substrate 104. Furthermore, at least one of the conductive barrier layer 108 and/or the seed layer 112 may serve as an electrically conducting electrode during electrolytic plating of the first metal feature 324.

In the illustrated embodiment, both the conductive barrier layer 108 and the seed layer 112 are formed prior to plating the first metal feature 324. However, here and in various other embodiments described throughout this specification, it will be appreciated that the conductive barrier layer 108 and/or separate adhesion layer (not shown) may be omitted. In these embodiments, a single layer may serve as conductive barrier and/or adhesion layer and a seed layer for the subsequent electroplated first metal feature 324. For example, when the seed layer 112 is formed of a material which additionally serves as a barrier layer to suppress atomic diffusion therethrough and/or as an adhesion layer, a separate conductive barrier layer 108 and/or an adhesion layer may be omitted.

It will be appreciated that, when the first metal feature 324 is formed by electrolytic plating, at least one of the substrate 104, the conductive barrier layer 108 and the seed layer 112 is electrically conducting to serve as an electrode. Thus, when the substrate 104 is electrically insulating, one or both of the conductive barrier layer 108 and the seed layer 112 formed of electrically conductive material may serve as an electrode.

The electrically conductive barrier layer 108 and the seed layer 112 may be formed using suitable deposition processes, e.g., physical vapor deposition (PVD), chemical vapor deposition (CVD), evaporation or plating.

In a similar manner as described above with respect to FIG. 1B, FIG. 3B illustrates forming a first blanket masking layer on the substrate 104 and forming an opening 320 having a width $W_0$ therethrough to form a first masking layer 116 (intermediate structure 300B of FIG. 3B) over the substrate 104. The opening 320 is formed using a first optical mask or a reticle.

As described herein and throughout the specification, a masking layer such as the masking layer 116 may include, e.g., a resist or any suitable organic or polymeric material that can be patterned, such as photosensitive materials patterned by exposure to light including, e.g., positive or negative photoresists such as polymethylmethacrylate (PMMA), thermally stable aromatic polymers (BCB or benzo-cyclo-butadiene), SU-8 epoxy resin and polyimides, to name a few. In other embodiments, resist can be patterned in other manners, such as stamping or imprinting. A blanket masking layer, e.g., a blanket photoresist layer, may first be formed to coat the substrate 104 using, e.g., a spin coating process. In some processes, a blanket photoresist layer may be soft baked, e.g., at a low temperature (e.g., 50° C. to 100° C.), followed by selectively exposing regions of the photoresist layer to light using an optical mask (not shown), also referred to as a photomask or a reticle. The optical mask may be configured to, e.g., expose a region of the masking layer 116 for forming the opening 320 through the masking layer 116 having a width $W_1$. The light can be a UV light having, e.g., a wavelength between 350 nm and 450 nm. In some processes, the exposed photoresist may be post-expose soft baked, e.g., at a low temperature (e.g., 50° C. to 100° C.). Subsequently, photoresist having exposed regions is developed in a developer solution to form the pattern of the masking layer 116, followed by rinsing and drying. In some processes, thus formed masking layer 116 may be hard baked at a higher temperature, e.g., 150° C. to 200° C. In the illustrated example, the masking layer 116 has formed therethrough the opening 320 which exposes the underlying seed layer 112.

As described herein and throughout the specification, the masking layer 116 may be formed of a positive masking layer, e.g., a positive photoresist in which portions that are exposed to light become soluble and are dissolved by a photoresist developer, while unexposed portions remain insoluble to the photoresist developer. However, in some other example processes, the masking layer 116 may be formed using a negative masking layer, e.g., a negative photoresist in which portions that are exposed to light become insoluble in a photoresist developer, while unexposed portions are insoluble in the photoresist developer.

In a similar manner as described above with respect to FIGS. 1C and 1E, FIGS. 3C and 3D illustrate plating a first metal in the opening 320 to form the first metal feature 324 in the opening 320 (FIG. 3C) and subsequently removing the first masking layer 116 using a suitable stripping process to form the first metal feature 324 (FIG. 3D). For example, when the second masking layer 116 is formed of photoresist, the masking layer 116 may be removed by oxidizing or ashing to volatilize the masking layer 116 under a dry oxidizing atmosphere including, e.g., ozone, oxygen plasma or oxygen radicals, or using a suitable wet stripping process, thereby exposing the underlying seed layer 112 as illustrated.

As described above with respect to FIGS. 1A-1F, the first metal feature 324 may include or be formed of a suitable material, e.g., gold and/or copper, depending on the technology. While metallization structures formed of electroplated gold has long served the electronics industry with its relatively superior electrical conductivity as well as chemical inertness, electroplated copper can offer advantages over gold in some circumstances. While offering significant commercial advantages over gold due to its lower cost, copper may be a good replacement for gold under some circumstances due to its similar electrical properties compared to gold, including inductance and self-capacitance and lower electrical resistivity. In applications where resistance can negatively impact circuit performance, copper can offer an improvement over gold. However, under some other circumstances, e.g., where copper may undesirably diffuse into adjacent interlayer dielectrics and/or substrates, having at least the outer portions of the metallization structures formed of gold may be advantageous.

Still referring to FIGS. 3B-3D, unlike the example illustrated with respect to FIGS. 1A-1F, in which the opening 120 (FIG. 1B) formed through the first masking layer 116 has substantially the same width $W_1$ as the as the target width $W_1'$ of the metal feature 124 (FIG. 1F), the opening 320 illustrated with respect to FIG. 3B formed using the first optical mask or the reticle and the resulting initial width $W_0$ of the first metal feature 324 is substantially smaller than the target width ($W_2'$ in FIG. 3H) of the final metallization structure because a second metal is electroplated to encapsulate the first metal feature 324 including top and side surfaces thereof, as described infra.

In various embodiments described herein, as described above, the first masking layer 116 may be designed, e.g., by a manufacturer and/or the application process, to be used within a specified range of thicknesses for optimized manufacturability. For example, as formed, the first masking layer 116 can have a thickness $t_{PR1}$ that is less than 1 micron, 1 to 5 microns, 5 to 10 microns, 10 to 15 microns, 15 to 20 microns or greater than 20 microns, or a value within any range defined by these values, for instance about 10 microns.

In various embodiments described herein, the thickness $t_1$ of the first metal feature 324 has a thickness that is smaller than or equal to the thickness $t_{PR1}$ of the first masking layer 116. For example, the $t_1$ may have a value represented by a percentage of the $t_{PR1}$ described above, e.g., about 50%, 60%, 70%, 80%, 90%, 100% or a value within a range defined by any of these values. In the illustrated embodiment, because the $t_1$ is smaller than or equal to the $t_{PR1}$, the resulting first metal feature 324 does not form a bread loaf structure. In other embodiments, $t_1$ may be greater than $t_{PR1}$ and bread loafing may occur (see, e.g., FIGS. 6A-7G discussed below).

Referring to an intermediate structure 300E of FIG. 3E, after removing the first masking layer 116 (FIG. 3D), a second masking layer 316 is formed on the same seed layer 112 that were employed for the first plating. Similar to forming the first masking layer 116, the second masking layer 316 may include, e.g., a photoresist or any suitable organic or polymeric photoactive material that can be lithographically patterned by exposure to light. In a similar manner to forming the first masking layer 116 as described above with respect to FIG. 3B, to form the second masking layer 316, a blanket masking layer, e.g., a blanket photoresist, is first formed on the seed layer 112, followed by selectively exposing using a second optical mask or a reticle (not shown) and developing to form the second masking layer 316 having formed therethrough a second opening 322 having a width $W_1$ wider than the width $W_0$ of the first opening 320 formed through the first masking layer 116. Thus formed second opening 322 leaves expose a surface portions 112S on each side of the first metal feature 324. The exposed surface portions 112S can expose the seed layer 112 and have a width corresponding to a difference $\Delta W$ between the $W_1$ and the $W_0$. The skilled artisan will understand that, in the illustrated embodiment and other analogous embodiments in the specification, while only one dimension, e.g., x-dimension, is shown in FIG. 3E in which the width or the x-dimension of a conductive line is wider, the second opening 322 may also be larger than the feature 324 in other dimensions, such as, e.g., the y-dimension.

In various embodiments, the second masking layer 316 may be designed, e.g., by a manufacturer and/or the application process, to be used within a similar or different specified range of thicknesses compared to the first masking layer 116. For example, as formed, the second masking layer 316 can have a thickness $t_{PR2}$ that is less than 1 micron, 1 to 5 microns, 5 to 10 microns, 10 to 15 microns, 15 to 20 microns or greater than 20 microns, or a thickness within any range defined by these values, for instance about 10 microns.

Referring to FIG. 3F, subsequent to selectively exposing using a second reticle and developing the exposed masking layer 316 to form the second masking layer having the second opening 322, a second metal 328 is electroplated in the second opening 322 on the exposed surface portions 112S and on the first metal feature 324, including sidewalls and the top surface thereof, thereby forming a metallization structure 332, which may be, for example, a metal line or via in a device such as an inductor or transformer for an isocoupler. The metallization structure 332 includes the second metal 328 at least partially encapsulating the first metal feature 324. In the illustrated embodiment, the second metal 328 may be formed of the same metal as the first metal feature 324, e.g. gold or copper, depending on the technology. However, embodiments are not so limited and in other embodiments, the second metal 328 may be formed of a different metal than first metal feature 324. For example, when the first metal feature 324 comprises or is formed of one of gold and copper, the second metal may comprise or be formed of the other of gold and copper.

Still referring to FIG. 3F, the topology of the metallization structure 332 thus formed by encapsulating the first metal feature 324 with the second metal 328 depends on, among other things, the relative magnitudes of the width difference $\Delta W$ between the $W_1$ and the $W_0$, and the thickness $t_2$ of the second metal 328 as described above with respect to FIG. 3E. For example, as in the illustrated embodiment, when the $\Delta W$ is about the same or greater than the thickness of the second metal 328, the resulting metallization structure 332 does not form a bread loaf structure as described above with respect to, e.g., FIG. 1D. That is, when the second metal 328 is conformally electroplated in the second opening 322, so long as the thickness $t_2$ of the second metal 328 does not substantially exceed the $\Delta W$, a width $W_2$ of the resulting metallization structure 332 remains at or below the $W_1$ of the second opening 322 formed in the second patterning layer 316 by the second reticle, both inside and outside the second opening 322. As a result, advantageously, while the sum of the $t_1$ of the first metal feature 324 and the $t_2$ of the second metal 328 is substantially greater than the thickness $t_{PR1}$ of the first masking layer 116 or the thickness $t_{PR2}$ of the second masking layer 316, unlike the intermediate structure 100D illustrated with respect to FIG. 1D, the resulting metallization structure 332 does not form a bread loaf structure, thereby reducing the risk of undesirable effects thereof, such as electrical shorting. In various embodiments described herein including the embodiment illustrated with respect to FIG. 3F, the thickness $t_2$ of the second metal 328 has a thickness that is equal to or smaller than the thickness $t_{PR2}$ of the second masking layer 316. For example, the $t_2$ may have a value represented by a percentage of the $t_{PR2}$, e.g., about 50%, 60%, 70%, 80%, 90%, or 100% or a percentage within a range defined by any of these values. While sidewalls of the metallization structure 332 are shown abutting sidewalls of the second masking layer 316, the skilled artisan will appreciate that, in some embodiments, the sidewall plating may stop short of the masking layer sidewalls.

In various embodiments, thus formed metallization structure 332 has a thickness that is a combined thickness of $t_1$ and $t_2$, which has a value that is substantially greater than the first and second masking layers 116, 316 used to form them. However, advantageously, the illustrated metallization structure 332 does not form a bread loaf structure. At the same time, the embodiment of FIG. 3F has more rounded upper corners compared to the conventional corners of FIG. 1C or 3C from plating through a mask. The skilled artisan will appreciate that the roundness of the corners is characteristic of a plating process that is conducted simultaneously on the exposed sidewalls and upper surface of the first metal feature 324, with exposed sidewalls, of FIG. 3E. It will be understood that such characteristic roundness appears in the product of FIG. 3H for this present embodiment, as well as the products of subsequently described embodiments (such as feature 532 in FIG. 5G, and feature 852 in FIG. 8K). The roundedness can be detected in a cross-sectional electron micrograph that can be obtained, e.g., using focused ion beam microscopy. The degree of roundedness can be quantified as a radius of curvature measured from a reference center, e.g., the corner formed by a junction between a sidewall and the upper surface of the first metal feature 324. According to various embodiments, the metallization structure 332 has a radius of curvature having a value that is equal to the $t_2$ of the second metal 328 or exceeding the $t_2$ by 10%, 20%, 50% or greater than the $t_2$. Embodiments that include the mushroom shape from breadloafing (such as feature 640 in FIG. 6H and feature 740 in FIG. 7G) also exhibit such characteristic rounded upper corners.

In various embodiments, the thus formed metallization structure 332 has a combined thickness $t_1+t_2$ of the first metal feature 324 and the second metal 328 which exceeds one or each of $t_{PR1}$ and $t_{PR2}$ by 20%, 40%, 60%, 80%, 100% or by a percentage in a range defined by any of these values. For example, the $t_1+t_2$ may be 2 to 10 microns, 10 to 20 microns, 20 to 30 microns, 30 to 40 microns or greater than 40 microns, or a thickness within any range defined by these values, for instance about 16 microns. The $t_1+t_2$ may be achieved by having each of the thicknesses $t_1$ and $t_2$, which may be about the same or different, that is 1 to 5 microns, 5 to 10 microns, 10 to 15 microns, 15 to 20 microns or greater than 20 microns, or a thickness within any range defined by these values, for instance about 8 microns. The first metal feature 324 and the second metal 328 may have thicknesses such that the ratio of $t_1/t_2$ is between about 0.5 and 1.5, between about 0.7 and 1.3, between about 0.9 and 1.1, or in a range defined by any of these values, for instance about 1. By way of illustration only, a target thickness for the metallization structure 332 may be about 16 microns, while a commercially available photoresist may typically provide a thickness of about 10 microns. When a single reticle process illustrated with respect to FIG. 1D is employed, the resulting metal feature may form a bread loaf structure. In contrast, in the illustrated embodiment, the first metal feature 324 and the second metal 328 may have thicknesses $t_1$ and $t_2$, respectively, each of about 8 microns, such that the resulting metallization structure 332 formed using two separate masking layers patterned with two separate reticles may have a combined thickness $t_1+t_2$ of about 16 microns that does not form a bread loaf structure.

Other topologies of the metallization structure 332 are possible at this stage. For example, as described infra with respect to, e.g., FIG. 5B, when the magnitude of the ΔW is substantially greater than the thickness $t_2$ of the second metal 328, the resulting metallization structure 532 (FIG. 5B) can include an elevated or raised portion. In these embodiments, the second metal 528 (together with the underlying seed layer 112 and barrier layer 108) encapsulates the first metal feature 524 and extends laterally beyond the first metal feature 524 such that the resulting metallization feature includes a raised portion formed the second metal 528 encapsulating the first metal feature and further includes portions formed by the second metal 528 that laterally extends to directly contact the seed layer 112.

FIG. 3G illustrates an intermediate structure 300G which shows, subsequent to formation of the metallization structure 332 illustrated with respect to FIG. 3F, removing the second masking layer 316 using a suitable stripping process to expose the seed layer 112, in a similar manner as described above with respect to FIG. 3D.

FIG. 3H illustrates an intermediate structure 300H after removing portions of the seed layer 112 and any underlying adhesion and/or the conductive barrier layer 108 that are exposed by removing the second masking layer 316 as described above with respect to FIG. 3G. The exposed portions of the adhesion layer, conductive barrier layer 108 and/or the seed layer 112 are removed in a similar manner as described above with respect to FIG. 1F, thereby forming the metallization structure 332. Because the thicknesses of the adhesion layer, the seed layer 112 and/or the conductive barrier layer 108 are relatively small (e.g., few hundred nm) compared to the thickness $t_2$ (e.g., few microns) of the second metal 328, the amount of the second metal removed as a result of removing the adhesion layer, the conductive barrier layer 108 and the seed layer 112 may also be relatively small. Thus, the resulting second metal 328 has a thickness $t_2'$ that may be substantially the same as the thickness $t_2$ prior to removal of the adhesion layer, the conductive barrier layer 108 and/or the seed layer 112. Accordingly, the thicknesses of the metallization structure 332 before and after removing the adhesion layer, the seed layer 112 and/or the conductive barrier layer 108 remain relatively unchanged ($t_1+t_2$ before versus $t_1+t_2'$ after the removal of the adhesion layer, the seed layer 112 and/or the conductive barrier layer 108).

Thus, the metallization structure 332 formed according to the process illustrated above with respect to FIGS. 3A-3H uses two optical masks or reticles to first electroplate a first metal 324 in a first opening 320 formed through a first masking layer 116, where the first opening defines a first region of the substrate, followed by plating a second metal 328 in a second opening 322 formed through the second masking layer 316, where the second opening defines a second region of the substrate. The second opening 322 is wider than the first opening 320 in one or both of the x and y dimensions, and the second region encompasses the first region of the substrate. The resulting metallization structure 332 comprises the first metal feature 324 encapsulated by the second metal 328, where each of the first metal feature 324 and the second metal 328 contacts the same seed layer 112, and overlies the same barrier 108 and/or adhesion layer, when present. It will be appreciated that, when the seed layer 112 is formed of the same material as the first metal feature 324 or the second metal 328, it may not be distinguishable from the respective layer formed of the same material in a cross-sectional view. In these embodiments, as described with respect to FIGS. 3A-3H and other embodiments described infra, the metallization structure 332 comprises the first metal feature 324 encapsulated by the second metal 328, where each of the first metal feature 324 and the second metal 328 contacts the same adhesion layer or the barrier layer 108. In various embodiments, the resulting metallization structure 332 is formed at a single metallization level. Advantageously, while the metallization structure has a thickness that may substantially exceed the thicknesses of many commercially available masking layers as described above, the resulting metallization structure 332 can be substantially free of a bread loaf structure, unlike the intermediate structure 100D illustrated with respect to FIG. 1D.

Deep Vias Formed Using Electroplated Thick Metallization Structures

Figure 4:
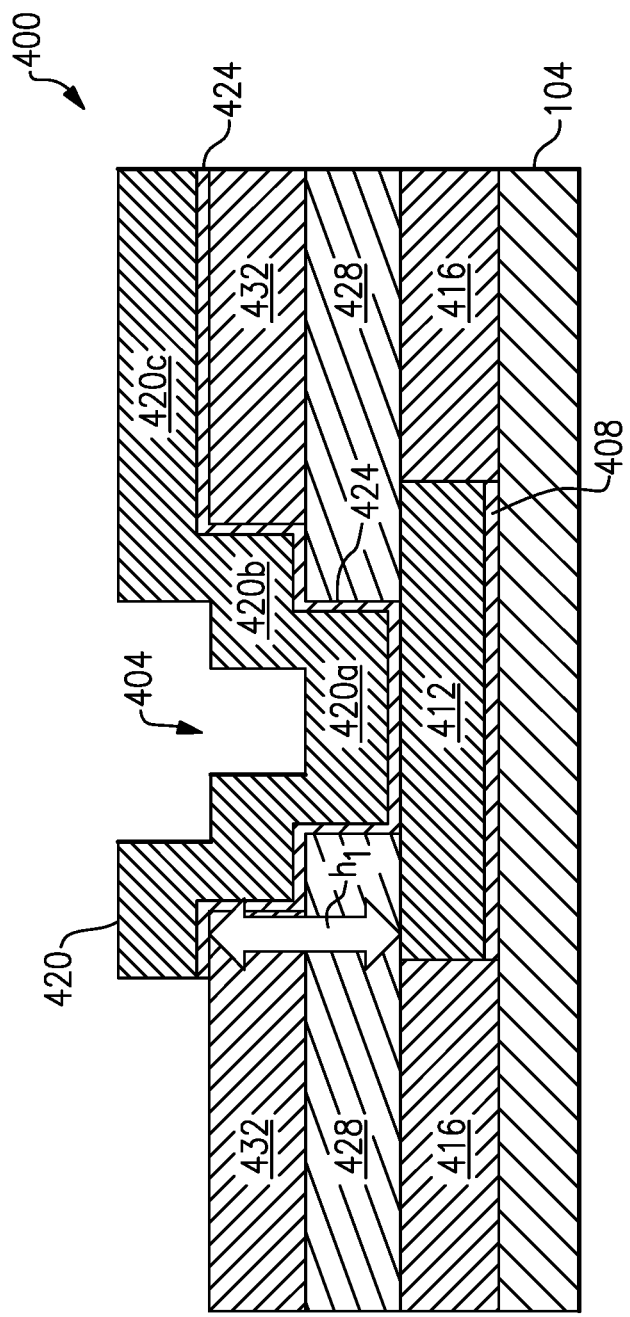
FIG. 4 illustrates an intermediate structure during fabrication of an electroplated via structure.

Some devices having electroplated metal structures include a plurality of metallization layers that are vertically interconnected by metal-filled vias, e.g., vias filled by electroplated metal. FIG. 4 illustrates an example intermediate structure 400 having such vias filled by electroplated metal. The intermediate structure 400 includes a plurality of electroplated metallization layers formed on a substrate 104 at different vertical levels. The intermediate structure 400 includes, e.g., a lower metal feature 412, e.g., a lower metal line, formed of a first metal within a first interlayer dielectric (ILD) layer 416 at a lower vertical level, and an upper metal feature 420c, e.g., an upper metal line, formed of a second metal at an upper vertical level, where the lower and upper metal features 412 and 420c are vertically interconnected by a via structure 404. The via structure 404 may be formed in an opening formed through one or more intermediate dielectric layers, e.g., second and third ILD layers 428, 432 formed at second and third and vertical levels, respectively, vertically between the lower and upper vertical levels. The via structure 404 includes portions 420a, 420b formed at the second and third vertical levels in the illustrated embodiment. In some example processes, the upper metal feature 420c and the via structure 404 are formed in a single process as a via metallization structure 420 by plating a second metal in via openings formed through a plurality of ILD layers. The second metal may be the same or different from the first metal of the lower metal feature 412.

In a similar manner as described above with respect to the intermediate structures illustrated in FIGS. 1A-1C, the lower metal feature 412 may be formed on the substrate 104 by plating on a seed layer 408. The via structure 404 may be formed in the via openings formed through the second and third ILD layers 428, 432, thereby forming the via structure 404 connected to the upper metal feature 420c. Each of the lower metal feature 412, the via structure 404 and the upper metal feature 420c may include a suitable material, e.g., gold and/or copper, depending on the technology, as described above.

Still referring to FIG. 4, the intermediate structure 400 including the lower metal feature 412 and the via metallization structure 420 including the upper metal feature 420c, the second metal feature 420a and the third metal feature 420b, may be fabricated as follows, according to one example. First, the lower feature 412 and the first ILD layer 416 are formed at the first vertical level according to the method described above with respect to FIGS. 1A-1C, except, in the illustrated example, the first ILD layer may be formed of a photosensitive dielectric, such as polyimide, which not only serves as a masking layer for patterning the lower metal feature 412 but which also remains as part of the final IC device, instead of being formed of a masking layer that is sacrificial, as further described infra. Subsequently, the second and third ILD layers 428, 432 may be successively formed, using similar materials and processes as those used to form the first ILD layer 416, such that the second and third ILD layers 428, 432 may permanently remain as part of the final IC device. Similar to the first dielectric layer 416, the second and third ILD layers 428, 432 may be formed by first blanket depositing or spin coating, followed by formation of openings therethrough. As illustrated, the openings formed in the second and third ILD layers 428, 432, are successively larger and formed using lithographic processes similar to those described above with respect to FIGS. 1A-1C, in order to facilitate subsequent deposition into a hole of significant depth without forming keyholes. Thereafter, a second seed layer 424 may be blanket deposited on the exposed top surface of the lower metal feature 412, sidewalls of the openings formed in the second and third ILD layers 428, 432, and upper surfaces of the third ILD layer 432. Adhesion and/or barrier layers may also be formed under the second seed layer 424. Subsequently, another blanket masking layer, e.g., a photoresist layer, may be formed on the blanket second seed layer 424, followed by exposing and developing to remove the masking layer from exposed areas of the second seed layer 424 on which the via metallization structure 420 to be electroplated. Subsequently, the via metallization structure 420 electroplated on the exposed surfaces of the second seed layer 424. Thereafter, upon removal of the masking layer followed by removal of the second seed layer 424 (and any underlying adhesion or barrier layers) in a similar manner as described above with respect to FIGS. 1E and 1F, the illustrated intermediate structure 400 is formed.

It will be appreciated that, in order to electroplate the second metal in the openings formed through the second and third ILD layers 428, 432 to form the via structure 404 with good electrical contact, prior to depositing the second seed layer 424, the exposed masking layer should be removed essentially completely from the openings. However, when the depth $h_1$ of the opening formed through the second and third ILD layers 428, 432 is relatively high, complete and/or uniform removal of the masking layer from the openings may be difficult. When the removal of the masking layer from the openings is incomplete and/or nonuniform prior to plating the via metallization structure 420, the remaining masking layer may cause failure of the resulting IC device, e.g., open circuit or low conductivity. The incomplete or uneven removal of the masking layer may be caused by, among other things, limited depth of focus and/or uneven exposure of the masking layer as a function of the depth $h_1$ during exposure. In addition, when aspect ratios of the openings formed through the second and third ILD layers 428, 432 are high, the complete removal of the masking layer therefrom may be difficult. To mitigate these and other difficulties associated with via formation, in the following, a fabrication method is described with respect to FIGS. 5A-5G in which, instead of forming a via structure or a via metallization structure by plating in a relatively deep opening to contact the lower metal feature as illustrated in FIG. 4, the second metal is electroplated in a relatively shallow opening, which is in part enabled by formation of a metal feature having an elevated or raised portion or a stud portion, which is fabricated in a manner similar that described above with respect to FIGS. 3A-3H.

Figure 5A:
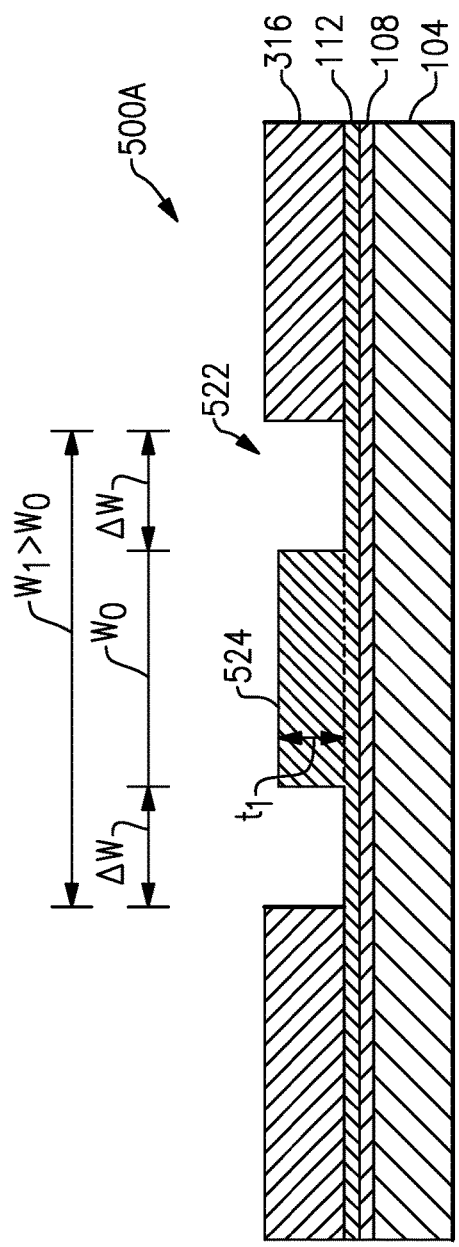
FIG. 5A illustrates an intermediate structure during fabrication of an electroplated via structure on a raised metallization structure, according to embodiments.

FIG. 5A illustrates an intermediate structure 500A fabricated using a process sequence similar to the process sequence illustrated above with respect to FIGS. 3A-3E. For example, after forming a first seed layer 112 with or without underlying adhesion and/or conductive barrier layer 108, a first metal feature 524 having a thickness $t_1$ and a width $W_0$ is formed by first forming a first opening having the width $W_0$ in a first masking layer (not shown), e.g., a photoresist layer, using a first reticle or optical mask, and plating a first metal therein. Thereafter, the first masking layer (not shown) is stripped and a second masking layer 316, e.g., a photoresist layer, having a second opening 522 having a width $W_1$ larger than the $W_0$ by $\Delta W$ is formed using a second reticle or optical mask. The resulting intermediate structure 500A is analogous to the intermediate structure 300E of FIG. 3E, except, the $\Delta W$ is greater than the thickness $t_2$ of the second metal 528, as described below with respect to FIG. 5B.

Figure 5B:
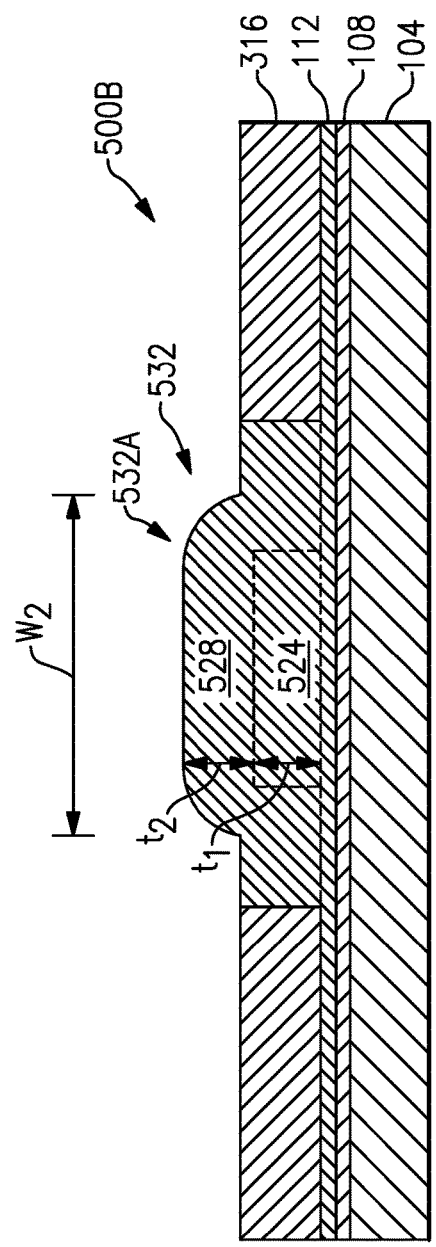
FIG. 5B illustrates an intermediate structure, subsequent to the intermediate structure illustrated with respect to FIG. 5A, according to embodiments.

FIG. 5B illustrates an intermediate structure 500B, after plating a second metal 528 in the second opening 522 and on the first metal feature 524 to a thickness $t_2$, thereby forming the metallization structure 532 having a combined thickness $t_1+t_2$ and the combined width $W_1$. The metallization structure 532 is formed using a process sequence similar to that illustrated above with respect to FIG. 3F except, because the $\Delta W$ is greater than the thickness $t_2$ of the second metal 528, the second metal 528 encapsulates the first metal feature 524 and laterally extends outside of the first metal feature 524 to form portions of the second metal 528 electroplated directly on the seed layer 112. That is, unlike the metallization structure 332 (FIG. 3H), the difference $\Delta W$ between the $W_1$ and the $W_0$ has a dimension such that the second metal 528, in addition to coating top and side surfaces of the first metal feature 524, laterally extends in the spaces between the first metal feature 524 and the sidewalls of the second masking layers 316, thereby forming a raised or elevated portion 532A or a stud portion having a width $W_2$ as illustrated in FIG. 5B. However, embodiments are not so limited, and in other embodiments, the $\Delta W$ may be comparable or smaller than $t_2$ such that a metallization structure similar to the metallization structure 332 not having the raised or elevated portion 532A may be formed, as illustrated with respect to FIG. 3F.

FIG. 5C illustrates an intermediate structure 500C, after removing the second masking layer 316 from the intermediate structure 500B of FIG. 5B, e.g., by stripping or ashing, thereby exposing the seed layer 112, in a similar manner as described above with respect to FIG. 3G. Thereafter, exposed portions of the seed layer 112 and any adhesion layer and/or the conductive barrier layer 108 are removed, in a similar manner as described above with respect to FIGS. 3G and 3H. Because a relatively small amount of the second metal 328 is removed during the removal of the seed layer 112, any adhesion layer and/or the conductive barrier layer 108, the second metal 528 has a thickness $t_2'$ and the metallization structure 532 (FIG. 5C) has a thickness of $t_1+t_2'$ that is substantially the same as the thickness $t_1+t_2$ of the metallization structure 532 prior to the removal of the seed layer 112, any adhesion layer and/or the conductive barrier layer 108 from regions exposed by removing the second masking layer 316 (FIG. 5B).

Referring to FIG. 5D, after forming the metallization structure 532 having the raised or elevated portion 532A, one or more interlayer dielectric (ILD) layers, e.g., a first ILD layer 536, a second ILD layer 540 and a third ILD layer 544 are formed over the substrate. The first, second and third ILD layers 536, 540, 544 may be formed of a suitable photosensitive electrically insulating material adapted to serve as a masking layer as well as a permanent ILD, e.g., photosensitive polyimide. In various embodiments, the metallization structure 532 having the raised or elevated portion 532A may first be buried in one or more ILD layers and subsequently be partially exposed by forming one or more openings through the one or more ILD layers. In the illustrated embodiment, the second ILD layer 540 has formed therein a first via opening 548 which exposes the raised or elevated portion 532A of the metallization structure 532, and the third ILD layer 544 has formed therein a second via opening 552 wider than the first opening and encompassing the first via opening, such that the resulting via opening through the second and third ILD layers 540, 544 form a staircase structure.

It will be appreciated that, because the metallization structure 532 includes the raised or elevated portion 532A, a combined depth $h_2$ of the first and second via openings 548, 552 through the second and third ILD layers 540, 544, respectively, is shallower compared to the corresponding combined depth $h_1$ through second and third ILD layers 423, 432 without a raised or elevated portion in the intermediate structure 400 illustrated with respect to FIG. 4 by an amount comparable to the height of the raised or elevated portion 532A of the metallization structure 532. Advantageously, the shallower depth provides, among other things, a relatively shallower range of depth of penetration for the light used to expose and remove the masking layer from first and second via openings 548, 552, thereby reducing the tendency for incomplete and/or nonuniform removal of the masking layer therefrom, prior to subsequently plating in the via openings 548, 552 to form a via metallization structure 564 (FIG. 5G), which in turn reduces the risk of device failures, e.g., open circuit or low conductivity. The shallower depth also facilitates deposition into the vias with less risk of keyhole formation due to faster deposition over corners, which naturally exhibit higher electric field strength during deposition.

In the illustrated embodiment, one or more of the first, second and third ILD layers 536, 540, 544 are formed of a photosensitive dielectric that can be patterned by photolithography, i.e., by being selectively exposed to light and developed. Unlike some photoresist layers that serve as temporary and sacrificial masking layers, however, the first, second and third ILD layers 536, 540, 544 serve as masking layers and ILD layers that remain as permanent part of the final IC device. In some embodiments, one or more of the first, second and third ILD layers 536, 540, 544 are formed of a photosensitive polyimide, which can be patterned, e.g., to form first and second via openings 548, 552 as illustrated in FIG. 5D, using a process analogous to photolithography. For example, to form one or more of the first, second and third ILD layers 536, 540, 544, a photosensitive polyimide may be patterned by being spun-on, baked, and exposed using a reticle or an optical mask. The exposed photosensitive polyimide layer may subsequently be developed to form a patterned masking layer, including, e.g., the first and second via openings 548, 552 as illustrated with respect to FIG. 5D. In some embodiments, the one or more of the first, second and third ILD layers 536, 540, 544 may be optionally thermally cured. Curing the first, second and third ILD layers 536, 540, 544 may provide, among other things, increased resistance to subsequent exposures to solvents and solutions and improved quality as permanent dielectric layers as part of the final IC device.

Figure 5E:
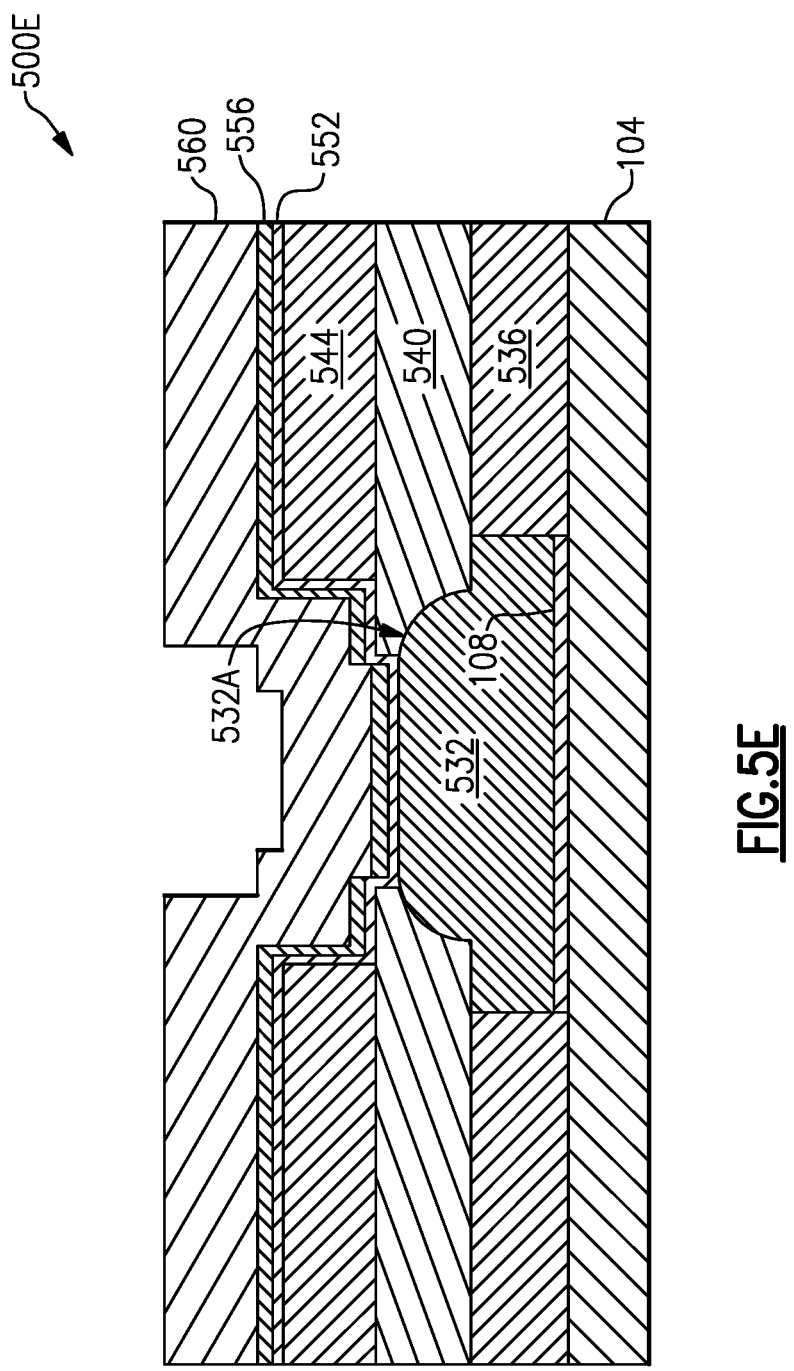
FIG. 5E illustrates an intermediate structure, subsequent to the intermediate structure illustrated with respect to FIG. 5D, according to embodiments.
Figure 5F:
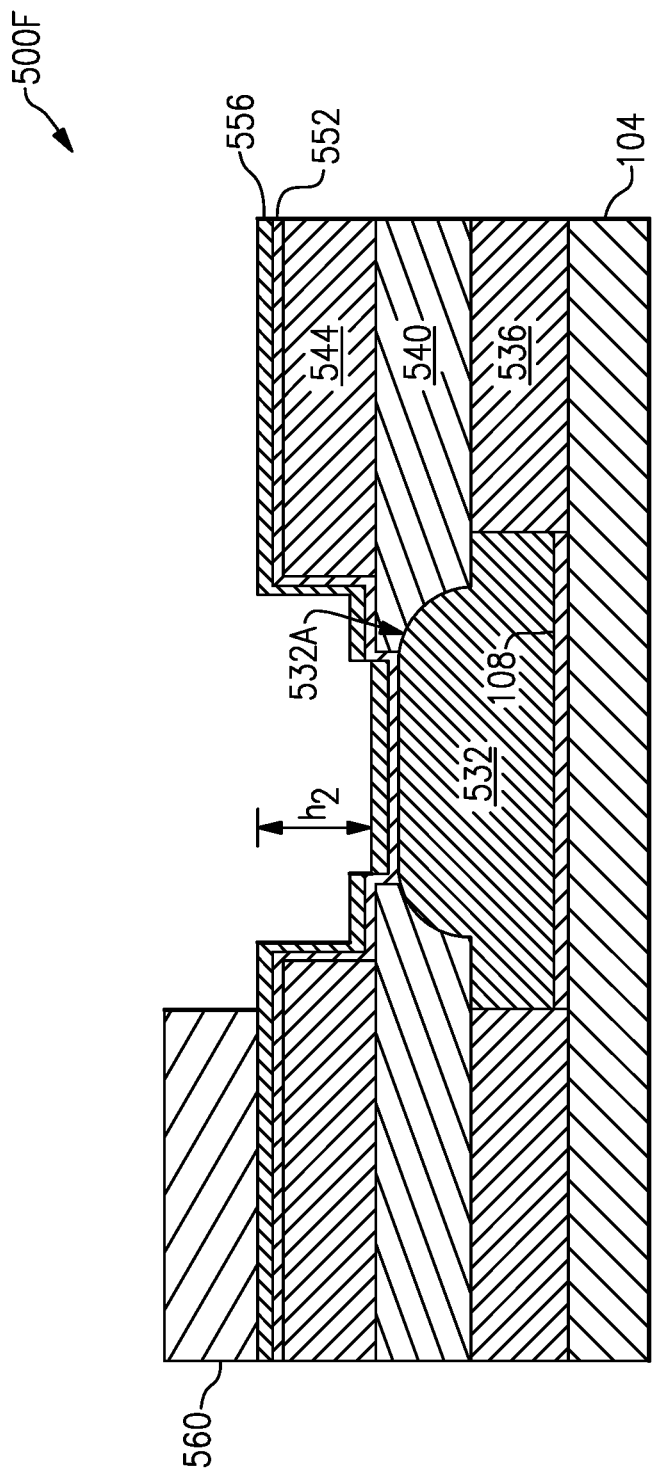
FIG. 5F illustrates an intermediate structure, subsequent to the intermediate structure illustrated with respect to FIG. 5E, according to embodiments.

Referring to FIG. 5E, after forming the first and second via openings 548, 552, a second seed layer 556 and any underlying adhesion layer and/or a second conductive barrier layer 552 may be blanket deposited on the surface of the intermediate structure 500D (FIG. 5D), thereby lining the inside and outside the first and second via opening openings 548, 552. The second conductive barrier layer 552 and the second seed layer 556 may serve similar functions and are formed using similar methods as the first conductive barrier layer 108 and the first seed layer 112, respectively, as described supra. In addition, similar to the first conductive barrier layer 108 and the first seed layer 112, the second seed layer 556 and one or both of the adhesion layer and the second conductive barrier layer 552 may be formed, according to different embodiments, depending on various factors including whether a subsequently electroplated via metallization structure 564 (FIG. 5G) is formed of a metal that is the same or different than the first metal feature 524 and/or the second metal 528. For example, when the first metal feature 524 and/or the second metal 528 are formed of gold and the third metal is formed of copper, the conductive barrier layer 552 and the seed layer 556 may be present to retard interdiffusion or diffusion of copper and/or gold therethrough. On the other hand, when the first metal feature 524 and/or the second metal 528 are formed of gold and the third metal is also formed of gold, the conductive barrier layer 552 may be omitted, and the seed layer 556 may also be omitted if the subsequent deposition does not rely upon it (e.g., CVD or sputtering). However, embodiments are not so limited and the conductive barrier layer 552 and the seed layer 556 may be present even when the first metal feature 524 and/or the second metal 528 are formed of gold and the third metal is also formed of gold.

Still referring to FIG. 5E, after any adhesion layer, the second conductive barrier layer 552 and the second seed layer 556 are formed, a third masking layer 560, which may be similar to the first and second masking layers 116, 316, e.g., a photoresist, may be blanket deposited on the second conductive barrier layer 552 or the second seed layer 556. The third blanket masking layer 560 may be patterned in a similar manner as described with respect to first and second masking layers 116, 316, to arrive at the intermediate structure 500F illustrated with respect to FIG. 5F, in which portions of the third blanket masking layer 560 have been removed from locations on which the via metallization structure 564 (FIG. 5G) is to be electroplated, as described below with respect to FIG. 5G.

Figure 5G:
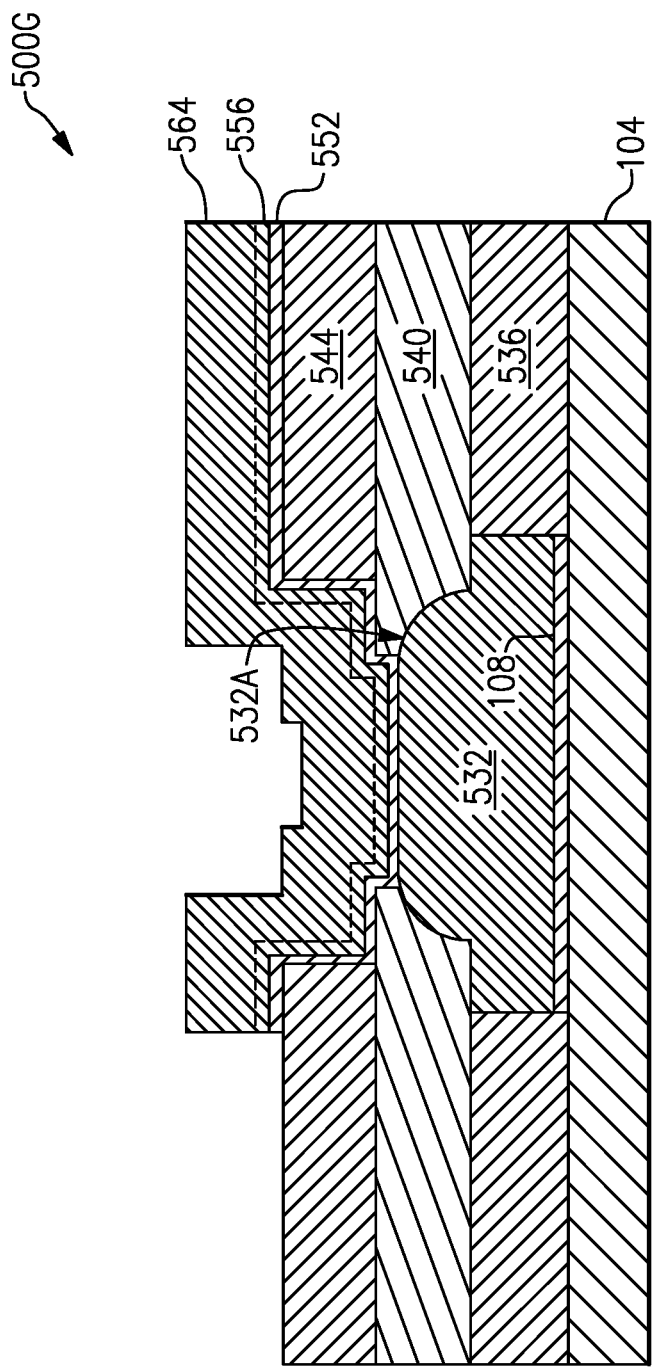
FIG. 5G illustrates an intermediate structure, subsequent to the intermediate structure illustrated with respect to FIG. 5F, according to embodiments.

FIG. 5G illustrates an intermediate structure 500G, after plating a third metal on areas from which the third masking layer 560 has been removed (FIG. 5F), removing the third masking layer 564 by stripping or ashing and removing the exposed second conductive barrier layer 552 and the second seed layer 556, thereby forming the via metallization structure 564.

Because the metallization structure 532 has the raised or elevated portion 532A, the combined depth $h_2$ (FIG. 5F) of the first and second via openings 548, 552 formed through the second and third ILD layers is shallower compared to the corresponding combined depth $h_1$ through the second and third ILD layers without the raised or elevated portion in the intermediate structure 400 described above with respect to FIG. 4, by an amount comparable to the height of the raised or elevated portion 532A. The shallower depth $h_1$ provides, among other things, a relatively shallower range of depth of penetration for the light used to expose the third masking layer 560 formed in the first and second via openings 548, 551, thereby reducing the tendency for incomplete and/or uneven removal of the third masking layer 560 therefrom, prior to subsequently electroplating in the vias openings 548, 551 to form the via metallization structure 564 (FIG. 5G). Thus formed via metallization structure 564 may result from a lower risk of device failures, e.g., open circuit or low conductivity.

Encapsulated Metallization Structures

According to various embodiments described above, by using different reticles or optical masks to electroplate metals in in successively larger and overlapping openings formed through different masking layers, metallization structures that are thicker (e.g., the metallization structure 332 in FIG. 3H) than the masking layers (e.g., first and second masking layers 116, 316 in FIGS. 3B, 3E) can be formed, while avoiding undesirable effects arising from overplating, e.g., breadloafing. As described above, these methods can be particularly beneficial for forming metallization structures for IC devices or packaging for IC devices where a relatively higher thickness (e.g., greater than 10 microns) of the metallization structures is employed. For example, in some of the embodiments described above, the metallization structures formed of, e.g., gold, are formed within ILD layers formed of, e.g., polyimide. Under some circumstances, the metallization structures formed of gold can be desirable for various reasons arising from properties of gold, including relatively low electrical resistivity, relatively low chemical reactivity, relatively high moisture resistance and relatively low diffusivity within ILD layers, among other properties. However, relative to other metals that can be electroplated, e.g., copper or nickel, gold can be substantially more expensive. Nevertheless, a complete replacement of gold with another metal may not be desirable or practical despite the potential cost savings under some circumstances. For example, when the metallization structures formed of certain other metals, e.g., copper, are in direct contact with substrate and or the ILD layers, atoms of the metallization structures may migrate thereinto or therethrough, thereby potentially causing electrical failures. To address these and other needs and concerns, in the following, methods of forming thick composite metallization structures formed of a plurality of different electroplated metals are described, where one of the electroplated metals, e.g., copper, is at least partially encapsulated by another one of the electroplated metals, e.g., gold.

FIGS. 6A-6H illustrate a method of forming an encapsulated composite metallization structure having a thickness greater than the thickness(es) of masking layer(s) used to define the metallization structure, where the metallization structure is formed by first plating to form a first metal feature, followed by plating a second metal different from the first metal to at least partially encapsulate the first metal feature, according to various embodiments.

Figure 6A:
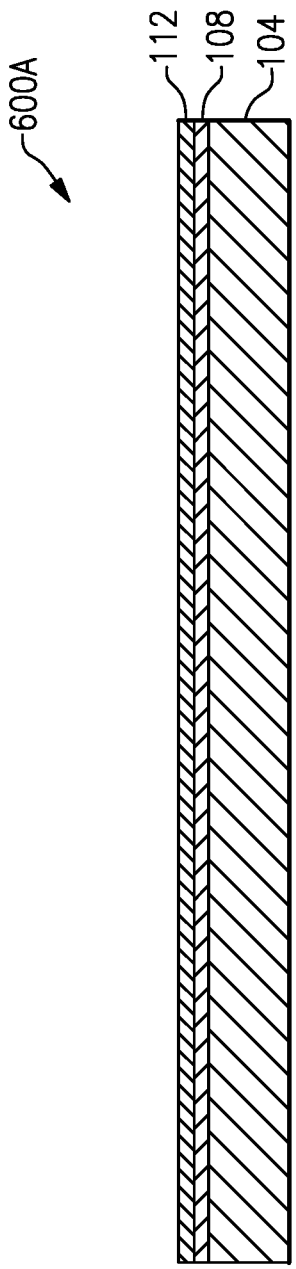
FIG. 6A illustrates an intermediate structure during fabrication of an encapsulated metallization structure, according to some embodiments.

FIG. 6A illustrates an intermediate structure 600A, formed in a similar manner as described above with respect to FIG. 3A, which comprises a substrate 104 having formed thereon an electrically conductive barrier layer 108 and a seed layer 112.

Figure 6B:
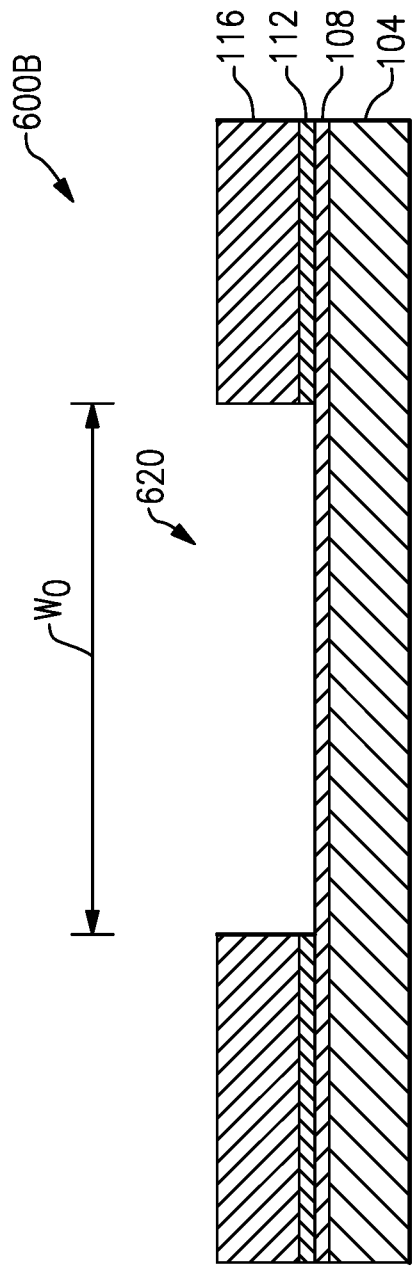
FIG. 6B illustrates an intermediate structure, subsequent to the intermediate structure illustrated with respect to FIG. 6A, according to some embodiments.

FIG. 6B illustrates an intermediate structure 600B, formed in a similar manner as described above with respect to FIG. 3B, including blanket depositing a first masking layer 116 on the conductive barrier layer 108 or the seed layer 112, and using a first reticle or optical mask to form a first opening 620 in a first masking layer 116 having a width $W_0$. However, unlike the intermediate structure 300B described above with respect to FIG. 3B, after forming the opening 620, the exposed seed layer 112 is removed from the opening 620, thereby exposing the underlying conductive barrier layer 108. After forming the first opening 620, the first masking layer 116 is removed.

Figure 6C:
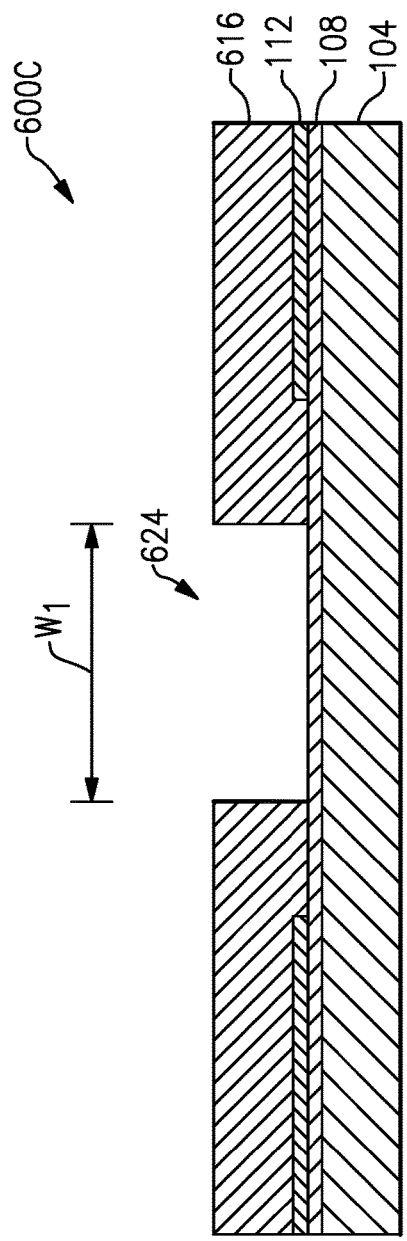
FIG. 6C illustrates an intermediate structure, subsequent to the intermediate structure illustrated with respect to FIG. 6B, according to some embodiments.

Referring to FIG. 6C, after removing the first masking layer 116, a second masking layer 616 is blanket deposited over the substrate 104, and a second reticle or optical mask is used to form a second opening 624 formed through the second masking layer 616 having a width $W_1$ smaller than the width $W_0$ of the first opening 620 formed through the first masking layer 116 (FIG. 6B). Because the $W_1$ is smaller than the $W_0$, the second masking layer 616 covers the seed layer 112 and portions of the conductive barrier layer 108 exposed by removing the seed layer 112 from the first opening 620 as illustrated in FIG. 6B.

Figure 6D:
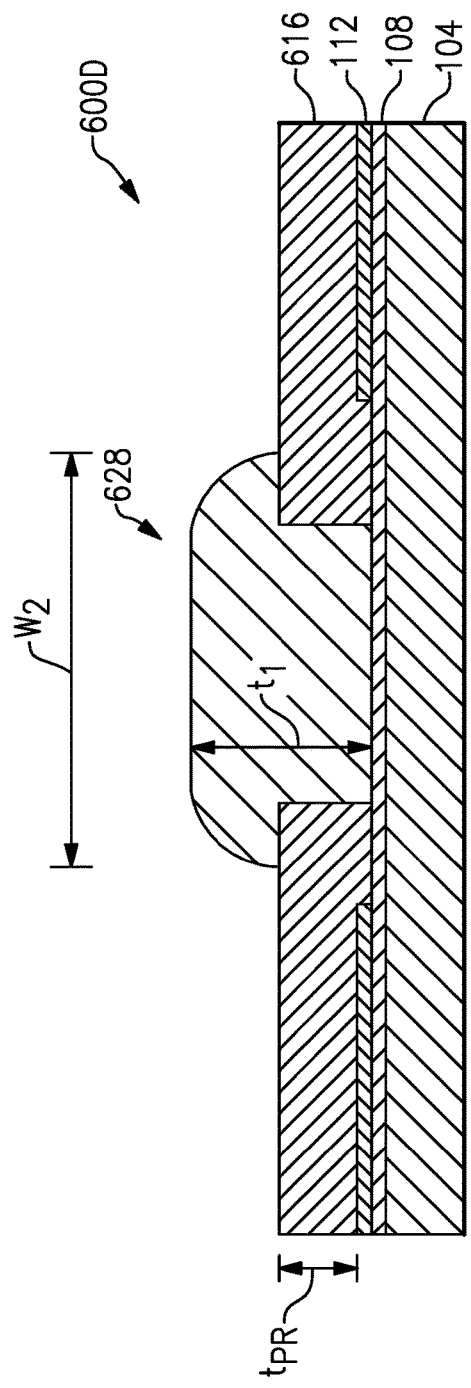
FIG. 6D illustrates an intermediate structure, subsequent to the intermediate structure illustrated with respect to FIG. 6C, according to some embodiments.

Referring to FIG. 6D, subsequent to forming the second opening 624, a first metal feature 628 is formed by plating a first metal in the second opening 624. In some embodiments, the first metal may be copper. However, embodiments are not so limited and in some other embodiments, the first metal may be gold or another metal. Unlike the first metal feature 324 described above with respect to FIG. 3C, in the illustrated embodiment, the first metal feature 628 is overplated to have a thickness $t_1$ that exceeds the thickness $t_{PR}$ of the second masking layer 616. When overplated as illustrated, the first metal feature 628 may grow laterally beyond the $W_1$ above the second opening 624, to form a bread loaf structure having a width $W_2$ above the second opening 624, in a similar manner as described above with respect to FIG. 1D. However, unlike FIG. 1D, because a second metal 636 subsequently encapsulates the bread loaf structure (FIG. 6F), certain undesirable properties of the bread loaf described above with respect to FIG. 1D may be mitigated, while advantageously forming a portion of the resulting metallization structure 640 (FIG. 6F) using a less expensive metal, e.g., copper. However, embodiments are not so limited, and in other embodiments, the first metal may not be overplated and the $t_1$ of the first metal feature 628 may have be less than the $t_{PR}$ such that a bread loaf structure is not formed. After plating or overlplating to form the first metal feature 628, the second masking layer 616 is removed.

Referring to FIG. 6E, after removing the second masking layer 616, a third masking layer 630 is blanket deposited over substrate 104 and the first metal feature 628, and a third reticle or optical mask is used to form a third opening 634 through the third masking layer 630 having a width $W_3$ wider than the $W_1$ of the second opening 624 (FIG. 6C), such that gaps 638 are formed laterally between the first metal feature 628 and the third masking layer 630 on both sides of the first metal feature 628. In some embodiments, the $W_3$ is about the same as the $W_0$ of the first opening 620 (FIG. 6B). However, $W_3$ may be larger or smaller than the $W_0$ of the first opening 620.

It will be appreciated that when the first metal feature 628 has a bread loaf structure as illustrated, portions of a the third masking layer 630 formed underneath the overhang regions of the bread loaf structure may be prevented from being exposed to light used to define the third opening 634. As a result, when the third masking layer 630 is formed of a positive masking layer, e.g., a positive photoresist, in which portions that are unexposed to light remain insoluble in a photoresist a developer, a complete removal of the third masking layer 630 from the overhang regions may be difficult. To address these and other concerns, in some embodiments, the third masking layer 630 may be formed of a negative masking layer, e.g., negative photoresist in which portions that are unexposed to light remains soluble. In these embodiments, by using a negative masking layer, the third opening 634 can be defined by exposing areas outside of the overhang regions, thereby obviating the concerns of incomplete removal of the masking layer from underneath the overhang regions.

Referring to FIG. 6F, after forming the third opening 634, a second conductive barrier layer 632 may be formed on, e.g., to at least partially encapsulate or envelope, the first metal feature 628. The second conductive barrier layer 632 is formed of a suitable material which may serve as a diffusion barrier and/or a seed layer for the second metal. In the illustrated embodiment, the second conductive barrier layer 632 is electroplated on conductive surfaces, including the exposed surfaces of the first metal feature 628 and the first conductive barrier layer 108 in the gaps 638. Thereafter, a second metal 636 is electroplated on the first metal feature 628. The second metal 636 at least partially encapsulates or envelopes the first metal feature 628. The resulting metallization structure 640 is thus formed, where the first electroplated metal feature 628 formed of a first metal, e.g., copper, is encapsulated by a second metal, e.g., gold.

As described above, in some embodiments, the first metal feature 628 may be formed of copper, while the second metal 636 may be formed of gold. As described above, by forming the metallization structure 640 as a composite metal structure, different characteristics of the component metals may provide complementary characteristics to the metallization structure 640. For example, gold has various desirable properties described above, e.g., relatively low tendency to migrate into surrounding ILD layers, while copper has various complementarily desirable properties, e.g., low resistivity and lower cost. Thus, by encapsulating the first metal feature 628 formed of copper with gold as the second metal 636, the metallization structure 640 can benefit from the low resistivity of copper while benefiting from the low tendency for migration of gold into the surrounding ILD layers. In addition, because copper is substantially cheaper than gold, the metallization structure 640 may provide substantial cost savings compared to a similar structure formed of gold. However, embodiments are not so limited, and in other embodiments, the first metal feature 628 and the second metal 636 may be formed of any combination of same of different electroplated metals.

When the first metal feature 628 is formed of copper and the second metal 636 is formed of gold, without a suitable barrier layer therebetween, the copper atoms from the first metal feature 628 may diffuse through the second metal 636 formed of gold, which can be undesirable. For example, copper may diffuse to the surface of the second metal 636 and form an oxide, thereby degrading the electrical conductivity and/or forming an open circuit. Thus, in various embodiments, a suitable material may be selected for the second conductive barrier layer 632 to serve as a diffusion barrier to suppress diffusion or interdiffusion of copper and/or gold atoms therethrough, and/or to serve as a seed layer for the second metal 636. In some embodiments, a suitable conductive barrier layer 632 may comprise nickel to serve as a diffusion barrier and/or a seed layer for gold. For example, the second conductive barrier layer 632 may be formed of elemental nickel or a nickel alloy, e.g., NiMn. The second conductive barrier layer 632 may be formed using a suitable process. For example, in the illustrated embodiment, the second conductive barrier layer 632 is selectively deposited on conductive surfaces including exposed surfaces of the first metal feature 628 and the first conductive barrier layer 108 by plating, such that the first metal feature 628 is conformally encapsulated. However, embodiments are not so limited, and in other embodiments, the second conductive barrier layer 632 may be formed using other suitable selective or nonselective techniques, e.g., chemical vapor deposition, atomic layer deposition or physical vapor deposition.

Still referring to the illustrated embodiment of FIG. 6F, the metallization structure 640 has an upper portion protruding above the third opening 634 and having width $W_4$ that is smaller than the $W_3$ of the third opening 634. In addition, the metallization structure 640 includes the second metal 636 formed in the gaps 638 that laterally extend to contact the third masking layer 630. The resulting metallization structure 640 includes a raised or elevated portion similar to the metallization structure described above with respect to FIG. 5B, except that the metallization structure 640 is a composite structure formed of a plurality of metals. However, it will be appreciated that, when the $W_4$ of the metallization is substantially the same as the $W_3$, the raised or elevated portion may not be present, in a similar manner as described above with respect to FIG. 3F.

FIG. 6G illustrates an intermediate structure 600G, after removing the third masking layer 630, thereby exposing the first seed layer 112 or the first conductive barrier layer 108 laterally outside the metallization structure 640.

FIG. 6H illustrates an intermediate structure 600H, after removing the first seed layer 112 and the first conductive barrier layer 108 laterally outside the metallization feature 640.

Thus formed metallization structure 640 has a thickness greater than the thickness of masking layers used to define the metallization structure 640, where the metal structure 640 is a composite structure formed by plating the first metal, e.g., copper to form the first metal feature 628, and plating the second metal 636, e.g., gold to encapsulate the first metal feature 628. The core of the metallization structure 640 formed of the first metal, e.g., copper, can thus provide high conductivity and/or lower cost, while the shell of the metallization structure 640 formed of the second metal, e.g., gold, can prevent the first metal from directly contacting the surrounding ILD layers. In addition, migration or diffusion of the first metal into or through the second metal 636 and into the substrate 104 and surrounding ILD layers can be retarded or suppressed by forming conductive barrier layers 108, 632 that encapsulate the first metal feature 628.

FIGS. 7A-7G illustrate an alternative method of forming a composite encapsulated metallization structure including a first metal feature encapsulated by a second metal different from the first metal, according to embodiments.

FIG. 7A illustrates an intermediate structure 700A, formed in a similar manner as described above with respect to FIGS. 3A and 6A.

FIG. 7B illustrates an intermediate structure 700B, after blanket depositing a first masking layer 116 on the conductive barrier layer 108 and/or the first seed layer 112 on a substrate 104, and using a first reticle or optical mask to form a first opening 720 having a width $W_1$ through the first masking layer 116, thereby exposing the first seed layer 112 (or the first conductive barrier layer 108 if the first seed layer 112 is not present), in a similar manner as descripted above with respect to FIG. 3B. Thereafter, on the exposed first conductive barrier layer 108 or the first seed layer 112, a second conductive barrier layer 704 is formed. A suitable material for the second conductive barrier layer 704 may be selected to serve as a diffusion barrier to further suppress, in addition to the first conductive barrier layer 108, the diffusion of the subsequently electroplated first metal into the substrate 104, and/or to serve as a seed layer for the first metal. For example, when the first metal is copper, a suitable conductive barrier layer 632 may comprise elemental nickel or a nickel alloy, e.g., NiMn, similar to the second conductive barrier 632 as described above with respect to FIG. 6F.

Figure 7C:
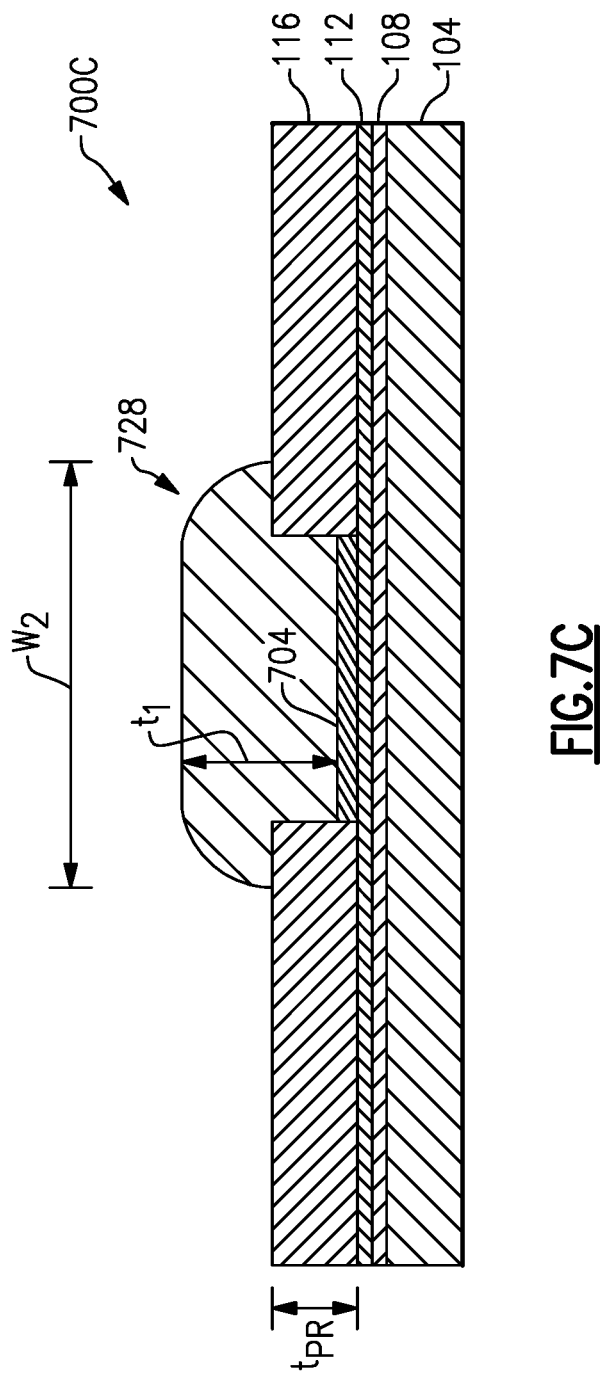
FIG. 7C illustrates an intermediate structure, subsequent to the intermediate structure illustrated with respect to FIG. 7B, according to some other embodiments.

Referring FIG. 7C, a first metal is electroplated into the first opening 720 to form the first metal feature 728. As described above with respect to FIG. 6D, the first metal feature 728 may be formed of a first metal, e.g., copper, and may be overplated to have a thickness $t_1$ exceeding the thickness $t_{PR}$ of the first masking layer 116 to form a bread loaf structure having a width $W_2$ above the first opening 720.

Referring to FIG. 7D, in a similar manner as described above with respect to FIG. 6E, after plating to form the first metal feature 728, the first masking layer 116 (FIG. 7C) is removed, and a second masking layer 716 is blanket deposited and patterned using a second reticle or optical mask to form a second opening 734 through the second masking layer 716 having a $W_3$ wider than the $W_1$, such that gaps 738 are laterally formed between the first metal feature 728 and the second masking layer 716 on both sides of the first metal feature 728. Unlike FIG. 6E, the first seed layer 112 is exposed in the gaps 738 and the second conductive barrier layer 704 is interposed between the first metal feature 728 and the substrate 104 to serve as a further diffusion barrier therebetween.

FIG. 7E illustrates an intermediate structure 700E, after forming a third conductive barrier layer 732 to at least partially encapsulate or envelope the first metal feature 728 and plating a second metal 736 different from the first metal to at least partially encapsulate or envelope the first metal feature 728, in a similar manner as described above with respect to FIG. 6F. Also similarly, a suitable material, e.g., NiMn, may be selected for the third conductive barrier layer 732 to serve as a diffusion barrier and/or as a seed layer for the second metal 736.

FIGS. 7F and 7G illustrate intermediate structures 700F, 700G after removing the second masking layer 716, and after removing the first seed layer 112 and the first conductive barrier layer 108 laterally outside the metallization feature 740, respectively, in a similar manner as described above with respect to FIGS. 6F and 6G.

Thus formed metallization structure 740 is similar to the metallization structure 640 described above with respect to FIG. 6G except, migration or diffusion of the first metal, e.g., copper, into the substrate 104 is further retarded or suppressed by the third conductive barrier layer 704 and/or the first seed layer 112 interposed between the metallization structure 740 and the substrate 104.

FIGS. 8A-8K illustrate an alternative method of forming a composite encapsulated metallization structure, where the metal structure is formed by first plating a first metal feature, and subsequently plating more than one additional metal to at least partially encapsulate the first metal feature, according to embodiments.

FIGS. 8A and 8B illustrate intermediate structures 800A and 800B, formed in a similar manner as described above with respect to FIGS. 7A and 7B. FIG. 8C illustrates an intermediate structure 800C, formed in a similar manner as described above with respect to FIG. 7C including forming a first metal feature 828 by plating a first metal in a first opening 720 formed using a first reticle or optical mask. However, unlike the intermediate structure 700C described above with respect to FIG. 7C, the first metal feature 728 is electroplated to have a width $W_1$ and a thickness $t_1$ that is about to equal to or less than the thickness $t_{PR}$ of the first masking layer 116, such that a bread loaf structure from overplating does not result.

FIG. 8D illustrates an intermediate structure 800D, fabricated in a similar manner as described above with respect to FIG. 7D, including removing the first masking layer 616 and forming a second masking layer 816 having formed therethrough a second opening 834 using a second reticle or optical mask. The second opening 834 has a width $W_3$ wider than the width $W_1$, such that first gaps 838 are formed between the first metal feature 828 and the second masking layer 816 on both sides of the first metal feature 828.

Subsequently, similar to as described above with respect to FIG. 7E, a third conductive barrier layer 832, e.g., NiMn, may be formed to at least partially encapsulate or envelope the first metal feature 828.

Referring to FIG. 8F, a second metal 836 same or different from the first metal is electroplated to at least partially encapsulate or envelope the first metal feature 828, thereby forming a first metallization structure 840.

FIG. 8G illustrates an intermediate structure 800G after the second masking layer 816 is stripped.

Figure 8H:
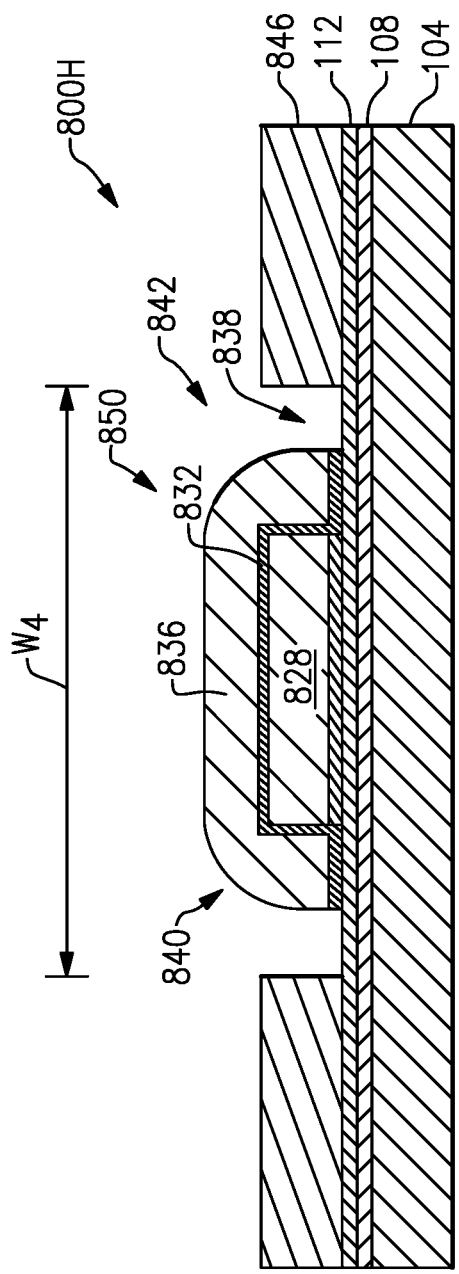
FIG. 8H illustrates an intermediate structure, subsequent to the intermediate structure illustrated with respect to FIG. 8G, according to some other embodiments.

FIG. 8H illustrates an intermediate structure 800H after forming a third masking layer 846 having formed therethrough a third opening 842 using a third reticle or optical mask. The third opening 842 has a width $W_4$ wider than the $W_3$ of the first metallization structure 840 (FIG. 8G), such that second gaps 838 are formed between the first metallization structure 840 and the third masking layer 846 on both sides of the first metallization structure 840.

Figure 8I:
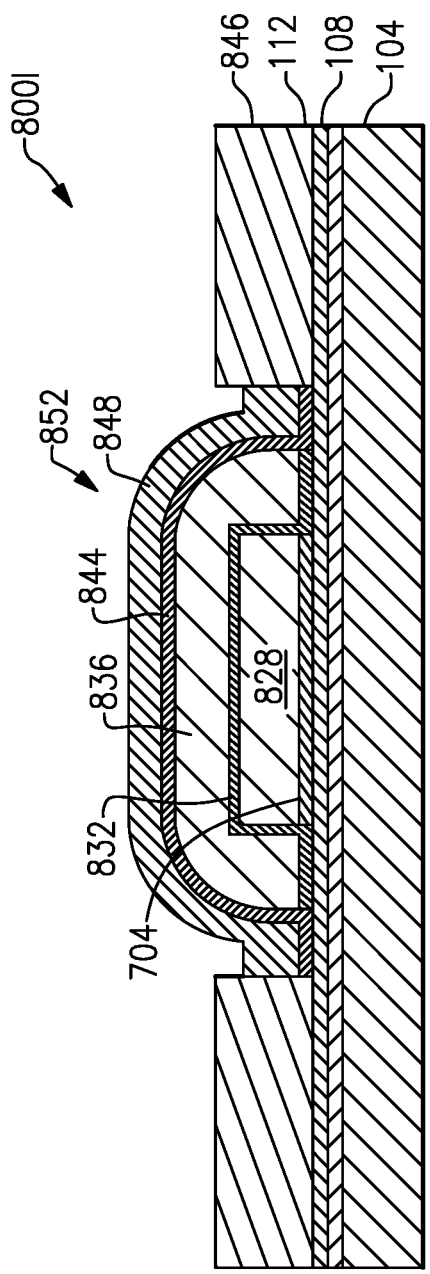
FIG. 8I illustrates an intermediate structure, subsequent to the intermediate structure illustrated with respect to FIG. 8H, according to some other embodiments.

Referring to FIG. 8I, a fourth conductive barrier layer 844, e.g., NiMn, may be formed to at least partially encapsulate or envelope the first metallization feature 840. After forming the third conductive barrier layer 844, a third metal 848 same or different from the second metal 836 and/or the third metal 836 is electroplated on the first metallization structure 840. The third metal 848 at least partially encapsulates or envelopes the first metallization structure 840, thereby forming a second metallization structure 852.

The resulting second metallization structure 852 is thus formed by sequentially plating one, two or three different metals. While not illustrated, additional metals can be further electroplated. In some embodiments, each of the first metal feature 828, the second metal 836 and third metal 848 can be formed of the same or different metal from each other, e.g., copper or gold For example, the first metal feature 828 and the second metal 836 can be formed of copper, while the outermost third metal 848 can be formed of gold.

FIG. 8J illustrates an intermediate structure 800J, after removing the third masking layer 846, thereby exposing the first seed layer 112 or the first conductive barrier layer 108 laterally outside the second metallization structure 852.

FIG. 8K illustrates an intermediate structure 800K, after removing the first seed layer 112 and the first conductive barrier layer 108 laterally outside the second metallization structure 852.

Thus formed second metallization structure 852 is similar to the metallization structure 740 described above with respect to FIG. 7G except, migration or diffusion of the first metal, e.g., copper, outside the first metal feature 828 may be further suppressed by the fourth conductive barrier layer 844.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of metallizing an integrated circuit device, comprising:
    plating a first metal on a substrate in a first opening formed through a first masking layer, the first opening defining a first region of the substrate;
    removing the first masking layer from the substrate;
    after removing the first masking layer from the substrate, forming a second masking layer on the substrate; and
    plating a second metal on the substrate in a second opening formed through the second masking layer, the second opening defining a second region of the substrate, wherein the second opening is wider than the first opening and the second region encompasses the first region of the substrate, and wherein plating the first metal forms a first metal feature and plating the second metal encapsulates the first metal feature to form a metallization structure that has a thickness greater than each of a thickness of the first masking layer and a thickness of the second masking layer; and
    after plating the second metal on the substrate, removing the second masking layer.

2. The method of claim 1, wherein the metallization structure is wider and thicker than the first metal feature.

3. The method of claim 2, wherein the thickness of the metallization structure exceeds each of the thickness of the first masking layer and the thickness of the second masking layer by at least 20%.

4. The method of claim 2, wherein the metallization structure is formed at a single metallization level.

5. The method of claim 2, wherein after plating the second metal, the metallization structure does not extend laterally beyond the second opening above the second opening.

6. The method of claim 2, wherein the first metal and the second metal comprise the same metal.

7. The method of claim 2, wherein plating the first metal and plating the second metal comprise plating on a common conductive barrier layer or a common seed layer.

8. The method of claim 7, wherein plating the second metal comprises encapsulating the first metal feature to form a raised portion and plating a portion laterally extending outside of the first metal feature directly on the common conductive barrier layer or the common seed layer.

9. The method of claim 8, further comprising forming a conductive via by plating a third metal in an opening formed through one or more dielectric layers to electrically contact the raised portion.

10. The method of claim 1, wherein the first opening is formed by selectively exposing portions of a first blanket masking layer using a first lithographic reticle and the second opening is formed by selectively exposing portions of a second blanket masking layer using a second lithographic reticle.

11. A method of metallizing an integrated circuit device, comprising:
    forming a first metal feature formed of a first metal on a substrate, after forming the first metal feature, forming a masking layer thereover and forming an opening therethrough, and encapsulating the first metal feature by plating a second metal in the opening formed through the masking layer to form a metallization structure, wherein the opening is wider than the first metal feature and laterally encompasses the first metal feature, and wherein the metallization structure has a thickness greater than a thickness of the masking layer; and
    removing the masking layer after plating the second metal.

12. The method of claim 11, wherein the first metal feature is formed by plating the first metal in a first opening formed through a first masking layer using a first lithographic reticle, and wherein the metallization structure is formed by plating the second metal in the opening formed through the masking layer using a second lithographic reticle.

13. The method of claim 12, wherein the first metal and the second metal comprise different metals.

14. The method of claim 13, further comprising forming a conductive barrier encapsulating the first metal feature prior to encapsulating the first metal feature with the second metal, wherein the conductive barrier serves as a diffusion conductive barrier for atoms of the first metal feature.

15. The method of claim 14, wherein the first metal feature is electroplated to a thickness greater than a thickness of the first masking layer, wherein the first metal feature comprises a portion outside the first opening that laterally extends wider than a width of the first opening.

16. The method of claim 15, wherein the masking layer is a negative photoresist.

17. A method of metallizing an integrated circuit device, the method comprising:
    forming a first metal feature on a substrate by filling an opening formed through a first masking layer with a first metal;
    removing the first masking layer;
    after removing the first masking layer from the substrate, forming a second masking layer on the substrate and forming a second opening through the second masking layer; and
    plating a conformal second metal on top and side surfaces of the first metal feature to form a metallization structure in the second opening,
    wherein the metallization structure has a thickness greater than each of a thickness of the first masking layer and a thickness of the second masking layer.

18. The method of claim 17, wherein plating the conformal second metal comprises filling the second opening formed though the second masking layer formed after removing the first masking layer.

19. The method of claim 17, wherein prior to forming the first metal feature, forming one or both of a conductive barrier layer and a seed layer on the substrate, and wherein after plating the conformal second metal, patterning the one or both of the conductive barrier layer and the seed layer to be laterally coextensive with the metallization structure.

* * * * *